United States Patent
Sharon et al.

(10) Patent No.: US 11,188,268 B1
(45) Date of Patent: Nov. 30, 2021

(54) PROGRAMMABLE PROCESSOR IN AN INTEGRATED MEMORY ASSEMBLY

(71) Applicant: Western Digital Technologies, Inc., San Jose, CA (US)

(72) Inventors: Eran Sharon, Rishon Lezion (IL); Alexander Bazarsky, Holon (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/885,801

(22) Filed: May 28, 2020

(51) Int. Cl.
  G06F 3/00 (2006.01)
  G06F 3/06 (2006.01)
  G11C 16/30 (2006.01)
  G11C 16/26 (2006.01)
  G11C 16/10 (2006.01)
  H01L 25/18 (2006.01)

(52) U.S. Cl.
  CPC .......... G06F 3/0659 (2013.01); G06F 3/0604 (2013.01); G06F 3/0679 (2013.01); G11C 16/10 (2013.01); G11C 16/26 (2013.01); G11C 16/30 (2013.01); H01L 25/18 (2013.01)

(58) Field of Classification Search
  CPC ...... G06F 3/0604; G06F 13/00; G06F 3/0655; G06F 3/0659; G06F 3/0673; G06F 3/0679; G06F 9/32; G06F 9/3802; G06F 9/3814; G11C 11/5642; G11C 16/04; G11C 16/0483; G11C 16/08; G11C 16/10; G11C 16/26; G11C 16/3459; G11C 11/56; G11C 11/5628; G11C 16/24; G11C 16/32; G11C 2207/107; G11C 5/066; G11C 7/1015; G11C 7/1039; G11C 8/08; G11C 8/12
  USPC ........................................ 365/185.17, 185.29
  See application file for complete search history.

(56) References Cited

U.S. PATENT DOCUMENTS

| | | | |
|---|---|---|---|
| 6,754,765 B1 | 6/2004 | Chang et al. |
| 6,765,813 B2 | 7/2004 | Scheuerlein et al. |
| 6,772,276 B2 | 8/2004 | Dover |
| 7,196,928 B2 | 3/2007 | Chen |
| 7,574,611 B2 | 8/2009 | Cohen |
| 7,600,090 B2 | 10/2009 | Cohen et al. |
| 8,074,022 B2 | 12/2011 | Okin et al. |

(Continued)

OTHER PUBLICATIONS

U.S. Appl. No. 16/723,192, filed Dec. 20, 2019 by Sharon et al.

*Primary Examiner* — Thong Q Le
(74) *Attorney, Agent, or Firm* — Vierra Magen Marcus LLP

(57) ABSTRACT

A programmable and reprogrammable processor on a control semiconductor die is disclosed. The processor controls various operations on a memory semiconductor die to which it is bonded, such as read, write, and erase. The processor issues control signals to operate circuits such as voltage regulators, sense amplifiers, and data latches. Because the processor is reprogrammable, it is possible to modify the operation of the circuits. For example, the processor can execute updated instructions to control the voltage regulators to modify the timing and/or magnitude of voltages applied to control lines in the memory semiconductor die. In one aspect, a page mapping scheme is updated in order to more evenly distribute a bit error rate (BER) across the pages. In one aspect, a read equalization scheme is updated. In one aspect, a technique for reading soft bits is updated.

20 Claims, 27 Drawing Sheets

(56) References Cited

U.S. PATENT DOCUMENTS

| | | |
|---|---|---|
| 8,683,149 B2 | 3/2014 | Ware et al. |
| 8,843,731 B2 | 9/2014 | Bueb et al. |
| 10,387,303 B2 | 8/2019 | Mehra et al. |
| 10,459,644 B2 | 10/2019 | Mehra et al. |
| 10,565,123 B2 | 2/2020 | Song et al. |
| 10,725,699 B2 * | 7/2020 | Hsu ........................ G11C 16/32 |
| 2010/0122097 A1 | 5/2010 | Cohen |
| 2017/0148510 A1 | 5/2017 | Bazarsky et al. |
| 2019/0179532 A1 | 6/2019 | Tseng et al. |
| 2019/0179568 A1 | 6/2019 | Hsu et al. |
| 2019/0179573 A1 | 6/2019 | Hsu et al. |
| 2019/0180824 A1 | 6/2019 | Hsu |
| 2019/0341375 A1 | 11/2019 | Hirano et al. |

\* cited by examiner

PROGRAMMABLE PROCESSOR IN AN INTEGRATED MEMORY ASSEMBLY

BACKGROUND

The strong growth in demand for portable consumer electronic devices is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Non-volatile semiconductor memory devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the non-volatile memory cells it is typical to use read reference voltages in order to determine what data state a memory cell is presently in.

In addition to the non-volatile memory cells, the memory structure also contains control lines, such as word lines, select lines, and bit lines. Devices such as sense amplifiers may be used to sense the memory cells. In some architectures, a hard-wired state machine is used to control the memory operations at the level of the memory structure and sense amplifiers. The hard-wired state machine responds to requests from a memory controller to perform various memory operations (e.g., read, write, erase). The hard-wired state machine controls detailed operation of the memory operations, such as applying voltages to the control lines and controlling the sense amplifiers.

DETAILED DESCRIPTION

Figure 1A:
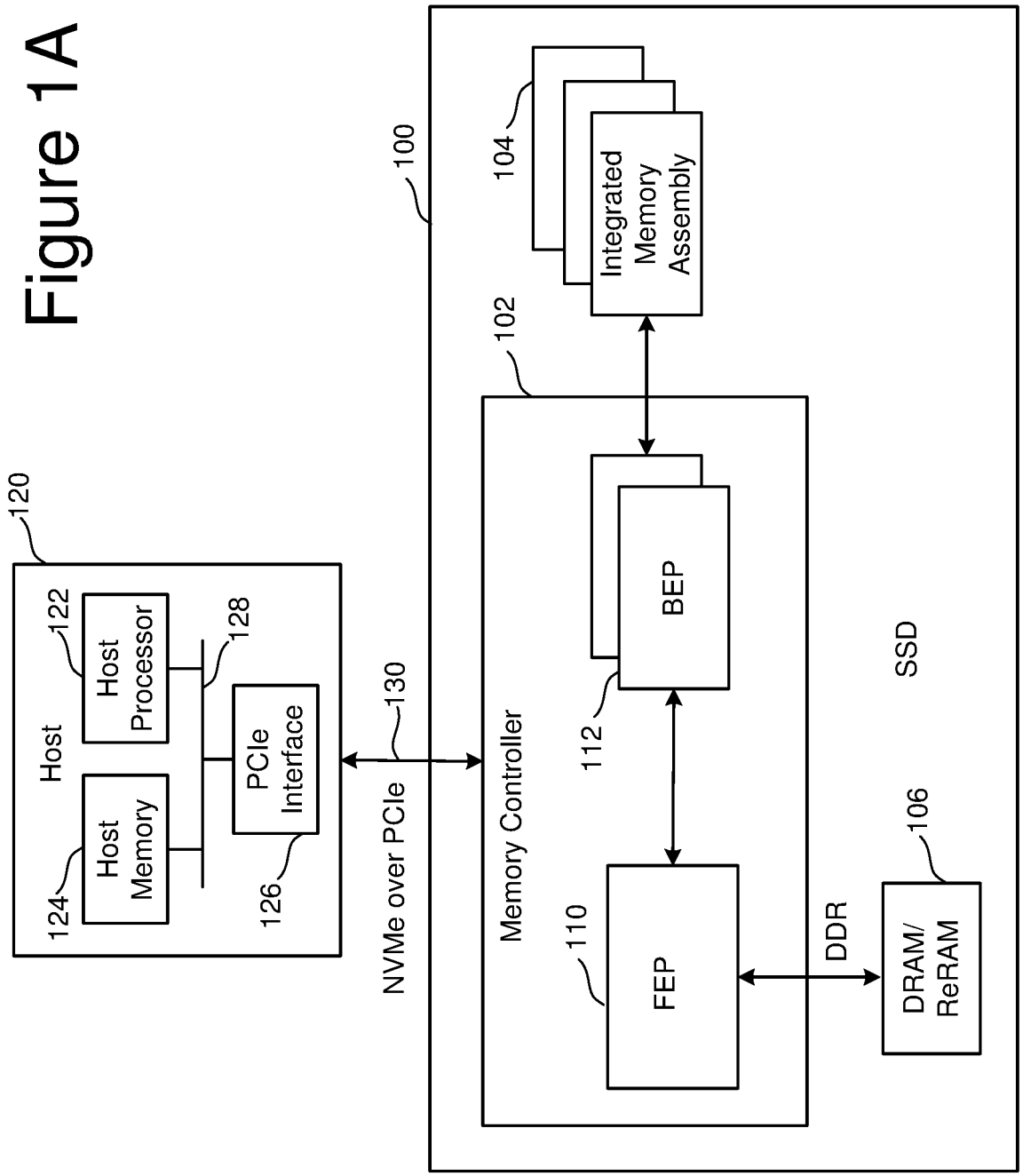
FIG. 1A is a block diagram of one embodiment of a memory system connected to a host.

The present technology will now be described with reference to the figures, which in embodiments, relate to a programmable and reprogrammable processor on a control semiconductor die. In an embodiment, the control semiconductor die is part of an integrated memory assembly having a control semiconductor die and a memory semiconductor die. In some embodiments, the control semiconductor die and the memory semiconductor die are die bonded together with, for example bond pads. The memory semiconductor die contains non-volatile memory cells. The programmable and reprogrammable processor on the control semiconductor die may control various operations on the memory semiconductor die, such as read, write, and erase. In some embodiments, the programmable and reprogrammable processor issues control signals to operate circuits such as voltage regulators, sense amplifiers, and data latches.

Because the processor is reprogrammable, it is possible to modify the operation of the circuits. For example, it may be determined that operation may be improved by changing the timing and/or magnitude of voltages applied to control lines in the memory semiconductor die. In some embodiments, the processor executes instructions, which could be stored on the memory semiconductor die and/or the control semiconductor die. By updating the instructions, the operation of the circuits can be changed. For example, the processor can execute the updated instructions to control the voltage regulators to modify the timing and/or magnitude of voltages applied to control lines in the memory semiconductor die.

Previous hard-wired state machine designs require tape-out or engineering change orders for each design change or new feature to be added to a memory system. This slows down and adds expense to the development process of a memory system. Also, it may be impossible, or at least impractical, to add a new feature if the development process of the memory system is too far along. However, embodiments of a control semiconductor die having a programmable and reprogrammable processor allow for design changes and/or new features to be added to a memory system.

Note that in some cases, the data for determining the best way to operate the memory system is not known until it is difficult or impossible to make changes to a hard-wired state machine. For example, some techniques for reading memory cells factor in the state of neighboring memory cells in order to compensate for interference from the neighboring memory cells. The amount of compensation depends on the amount of interference from the neighboring memory cells. The amount of neighbor interference depends on factors such as the amount of capacitive coupling between the neighbor and the memory cell being read, and the amount of charge on the neighbor memory cell (which is a function of the data programmed into the neighbor). Although modeling may be performed to predict the amount of neighbor interference, the amount of neighbor interference may be better determined based on actual measurements. However, it might not be practical to modify a hard-wired state machine after actual measurements are available. Embodiments of a programmable and reprogrammable processor allow for design changes after such actual measurements are available.

In some embodiments, a page mapping scheme is updated in order to more evenly distribute a bit error rate (BER) across the pages. A factor in deciding what page mapping scheme to use is the bit error rate (BER) of each page. However, the BERs of the different pages may not be known until after it is difficult or impossible to change a hard-wired state machine. Embodiments of a programmable and reprogrammable processor allow a page mapping scheme to be modified to, for example, evenly distribute a BER across the pages.

In some embodiments, the control die and the memory die are bonded together with many bond pads that permit communication between the control die and the memory die. In one embodiment, the control die is able to access data from the memory die through the bond pads. In one embodiment, each data bit and each parity bit of a codeword is read by way of a different bond pads. This, in effect, provides an interface that is much wider than a data bus between the integrated memory assembly and the memory controller. Therefore, transferring the codewords from the memory die to the control die is very efficient. A net effect is that having determining the new read reference voltages on the control die can be more efficient use of communication bandwidth than determining the new read reference voltages on the memory controller.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die. Hence, the control die may be better suited to perform operations such as determining new read reference levels than the memory die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

FIG. 1A-FIG. 3B describe one example of a memory system that can be used to implement the technology proposed herein.

FIG. 1A is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, integrated memory assembly 104, memory system 100, memory controller 102, or the combination of memory system 100 and host 120.

In one embodiment, there are a plurality of integrated memory assemblies 104. In an embodiment, each integrated memory assembly 104 includes one or more memory die and one or more control die. Each memory die may include one or more memory structures. A control die controls operation of a memory die. For example, a control die may control read, write, and erase operations on a memory die. In one embodiment, the memory controller 102 communicates with a control die in order to instruct the control die to perform read, write, or erase operations on one or more non-volatile memory die or one or more memory structures. In one embodiment, each memory die in the integrated memory assembly 104 utilize NAND flash memory (including two dimensional NAND flash memory and/or three dimensional NAND flash memory). In other embodiments, the integrated memory assembly 104 can include other types of memory; for example, the memory package can include PCM memory.

Memory controller 102 communicates with host 120 by way of an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
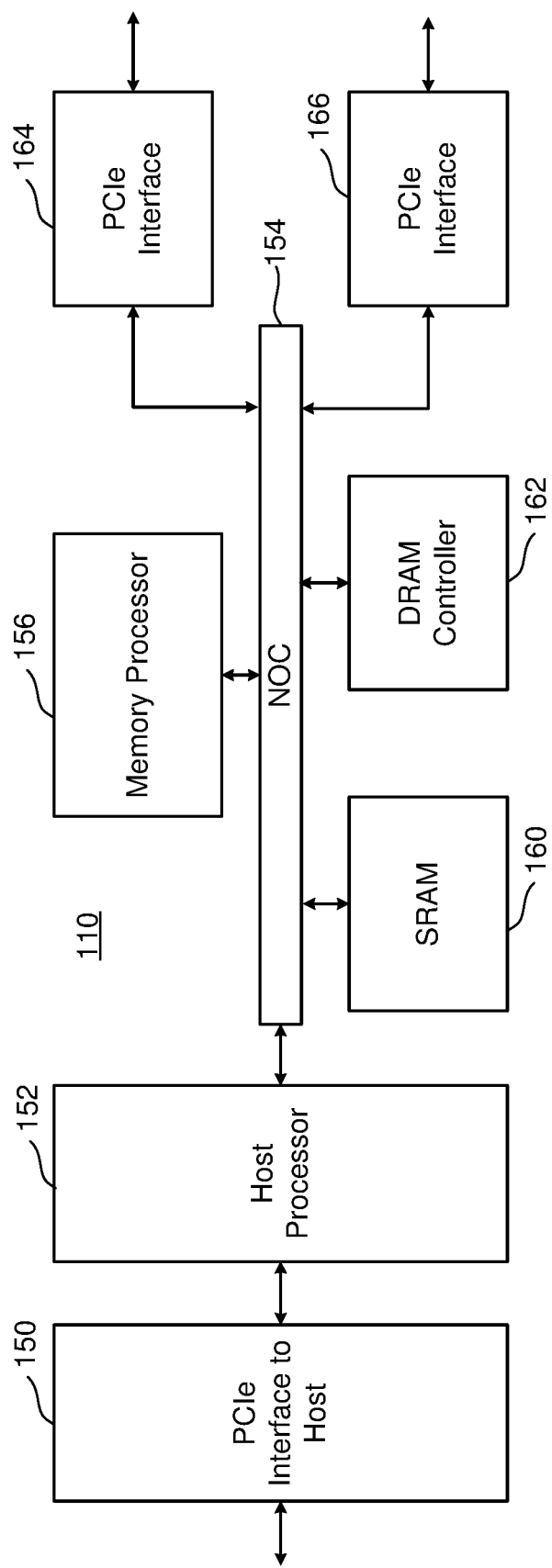
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2:
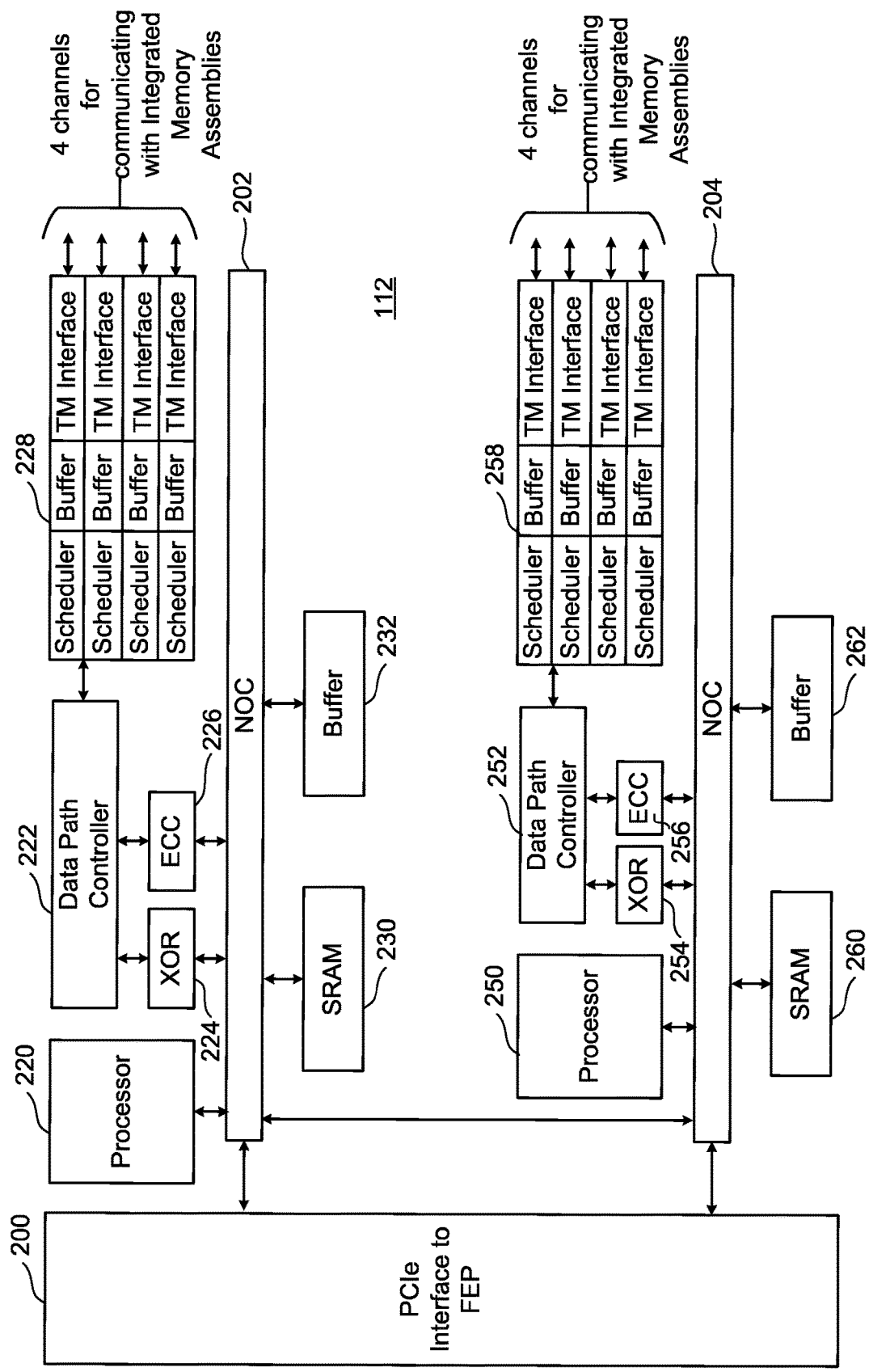
FIG. 2 is a block diagram of one embodiment of a Back End Processor Circuit.

FIG. 2 is a block diagram of one embodiment of the BEP circuit 112. FIG. 2 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2. Additionally, controllers with structures different than FIGS. 1B and 2 can also be used with the technology described herein.

Figure 3A:
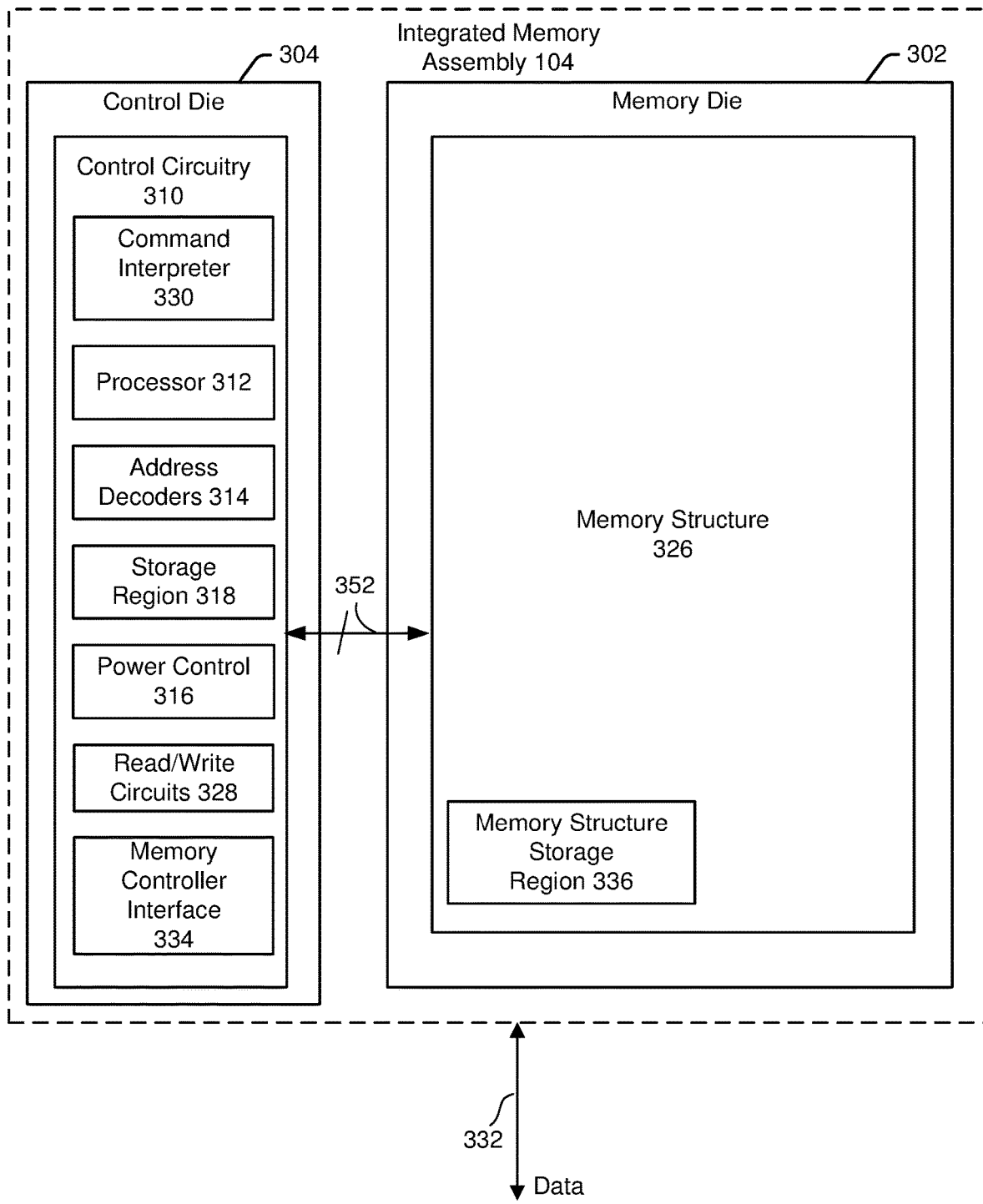
FIG. 3A is a functional block diagram of an embodiment of an integrated memory assembly.

FIG. 3A is a functional block diagram of one embodiment of an integrated memory assembly 104. In one embodiment, the integrated memory assembly 104 includes two semiconductor die (or more succinctly, "die"). Memory die 302 includes memory structure 326. Memory structure 326 may contain non-volatile memory cells. Control die 304 includes control circuitry 310. In some embodiments, the memory die 302 and the control die 304 are bonded together, as will be described in more detail below.

The control circuitry 310 performs memory operations (e.g., write, read, erase and others) on memory structure 326. The control circuitry 310 includes processor 312, an on-chip address decoders 314, a power control circuit 316, a storage region 318, read/write circuits 328, a command interpreter 330, and memory controller interface 334. In another embodiment, a portion of the read/write circuits 328 are located on control die 304, and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage. Herein, the term, "control die," "control semiconductor die," or the like, means a semiconductor die that contains control circuitry for performing memory operations on non-volatile memory cells on a memory die. Typically, numerous semiconductor die 304 are formed from a single semiconductor (e.g., silicon) wafer. Typically, numerous memory die 302 are formed from a single semiconductor (e.g., silicon) wafer.

The processor 312 is programmable and reprogrammable. The processor 312 may be a microprocessor. In one embodiment, the processor has a reduced instruction set computer (RISC) architecture. The processor 312 executes program instructions in order to control the memory die 302. The processor 312 controls operation of address decoders 314, power control 316, and read/write circuits 328.

The storage region 318 may be used to store the program instructions that are executed on the processor 312. The storage region 318 may be used to store various parameters and settings that are used to control the memory die 302. For example, the parameters and settings could include voltage levels of signals applied to the memory structure 326. The storage region 318 could contain either volatile memory (e.g., SRAM, DRAM) or non-volatile memory.

The memory structure 326 also has a memory structure storage region 336 to store program instructions that are executed on the processor 312. The memory structure storage region 336 may be used to store various parameters and settings that are used to control the memory die 302. In some embodiments, the control die 304 transfers program instructions, parameters, settings, and the like from memory structure storage region 336 to storage region 318 when the integrated memory assembly 104 is initialized (e.g., booted). In an embodiment, the control die 304 has hardware (e.g., a hard-wired state machine) to control the transfer from memory structure storage region 336 to storage region 318. The memory structure storage region 336 may be implemented in non-volatile memory cells that are not used to store user data.

In some embodiments, the program instructions that are executed by the processor 312 are updated by replacing a portion of the program instructions with updated (or modified) instructions. Various parameters and/or settings may also be updated. Such updates allows changes to be made to how the processor 312 operates the memory die 302. Such updates (or changes) may not be possible or practical to make in hardware, such as a hard-wired state machine.

Each memory structure 326 is addressable by word lines via a row decoder (not depicted in FIG. 3A) and by bit lines via a column decoder, in some embodiments. The on-chip address decoder 314 provides an address interface between addresses used by host 120 or memory controller 102 to the hardware address used by row decoders and column decoders (not expressly depicted in FIG. 3A). Power control circuit 316 controls the power and voltages supplied to the word lines, bit lines, and select lines during memory operations. Power control circuit 316 may include voltage generators (e.g., charge pumps) for generating voltages. The power control circuit 316 executes under control of the processor 312.

The read/write circuits 328 includes sense blocks (which may contain sense amplifies (SA)), in some embodiments. The sense amplifies include bit line drivers, in some embodiments. The read/write circuits 328 executes under control of the processor 312.

The command interpreter 330 is able to interpret commands that are provided by the memory controller 102. For example, the command interpreter 330 may interpret read, write, erase, and other commands. In some embodiments, the command interpreter 330 is implemented in hardware, such as a state machine. Optionally, the command interpreter 330 may be implemented by software that executes on the processor 312.

Memory controller interface 334 is an electrical interface for communicating with memory controller 102. For example, memory controller interface 334 may implement a Toggle Mode Interface that connects to the Toggle Mode interfaces of memory interface 228/258 for memory controller 102. In one embodiment, memory controller interface 334 includes a set of input and/or output (I/O) pins that connect to communication channel 332 (also refers to herein as a data bus). In one embodiment, communication channel 332 connects to the memory controller 102 as part of the Toggle Mode Interface. In one embodiment, a communication channel 332 of one integrated memory assembly 104 connects to another integrated memory assembly 104.

Communication channel 332 is depicted as being connected to integrated memory assembly 104 for generality. Communication channel 332 may connect to either or both of die 302 and/or 304. In one embodiment, communication channel 332 connects memory controller 102 directly to control die 304. In one embodiment, communication channel 332 connects memory controller 102 directly to memory die 302. If communication channel 332 connects memory controller 102 directly to memory die 302, then pathway 352 may be used to allow communication between memory controller 102 and control circuitry 310.

Any subset of components in the control circuitry 310 can be considered one or more control circuits. Processor 312, command interpreter 330, read/write circuits 328, and/or memory controller 102 (or equivalently functioned circuits), in combination with all or a subset of the other circuits depicted in FIG. 3A, can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory die 302. A portion of each pathway resides in the memory die 302 and a portion of each pathway reside in the control die 304. The term pathway may be used for portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. Pathways 352 allow the control circuitry 310 to provide voltages to word lines, select lines, and bit lines on memory die 302, in one embodiment. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include phase change memory (e.g., PCM), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 3A depicts one control die 304 and one memory die 302 in an integrated memory assembly 104, there may be more than one control die 304 and more than one memory die 302 in an integrated memory assembly 104.

Figure 3B:
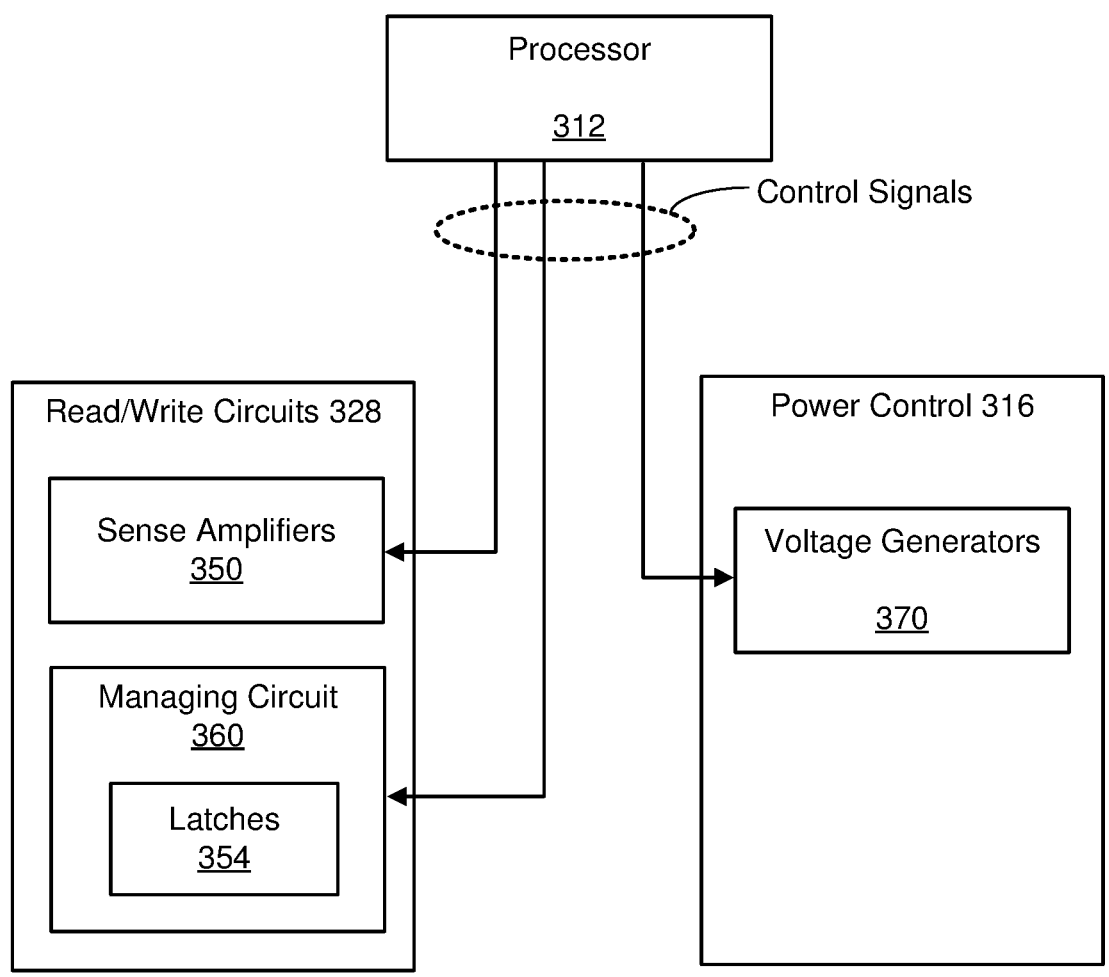
FIG. 3B is a block diagram of one embodiment of circuits under control of a processor of a control die.

FIG. 3B is a block diagram of one embodiment of the read/write circuits 328, power control 316, and processor of the control die 304. The read/write circuits 328 have sense amplifiers 350 and a managing circuit 360. The managing circuit 360 contains latches, as well as circuitry that operates the latches under control of the processor 312. In one embodiment, the latches store data bits and parity bits of a codeword. Based on the bits in the latches, the sense amplifiers 350 may control bit line voltages in the memory structure 326 when the non-volatile memory cells are being programmed. In this manner, the codewords may be programmed into non-volatile memory cells in the memory structure 326. In one embodiment, sense amplifiers 350 sense bit lines in the memory structure 326 in order to read a codeword. The managing circuit 360 may store the read codeword into latches 354.

The power control 316 contains voltage generators 370. The voltage generators 370 operate under control of the processor 312. The voltage generators 370 may include charge pumps. The voltage generators 370 output voltages, which may include high voltages such as program voltages and erase voltages. A high voltage may be defined as a voltage having a magnitude that is greater than a power supply voltage provided to the control die 304. The voltage generators 370 output voltages having a wide range of voltage magnitudes. Thus, the voltages could have a magnitude that is less than or equal to a power supply voltage provided to the control die 304. The voltages may be provided to the memory die 302 through drivers. The drivers may provide voltages to word lines, select lines, etc. In some cases, the drivers may provide a high voltage to bit lines, such as an erase voltage.

Figure 4:
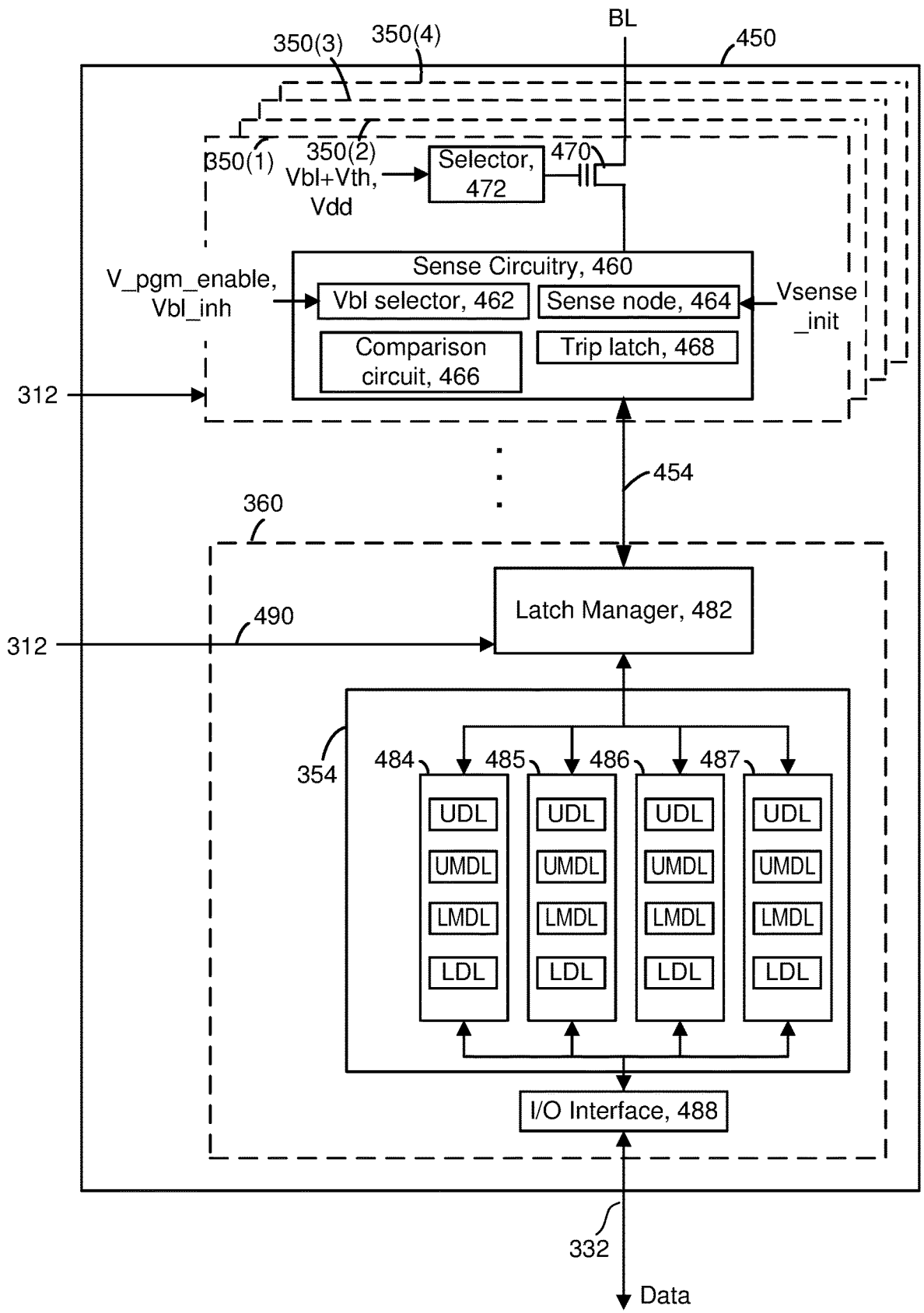
FIG. 4 is a block diagram depicting one embodiment of a sense block.

FIG. 4 is a block diagram depicting one embodiment of a sense block 450, which operates under control of processor 312. The sense block is part of the read/write circuits 328. There may be many sense blocks 450 in the read/write circuits 328. An individual sense block 450 is partitioned into one or more core portions, referred to as sense circuits or sense amplifiers 350(1)-350(4), and a common portion, referred to as a managing circuit 360. In one embodiment, there will be a separate sense amplifier for each bit line/NAND string and one common managing circuit 360 for a set of multiple, e.g., four or eight, sense amplifier. Each of the sense amplifier in a group communicates with the associated managing circuit 360 via data bus 454. Thus, there are one or more latch managing circuits which communicate with the sense amplifier of a set of storage elements (memory cells). The processor 312 controls the overall operation of the sense amplifiers 350 and the managing circuit 360; however, some aspects of the sense amplifiers 350 and managing circuit 360 may operate independent of control from the processor 312.

The sense amplifier 350(1), as an example, comprises sense circuitry 460 that performs sensing by determining whether a conduction current in a connected bit line is above or below a predetermined threshold level. The sensing can occur in a read or verify operation. The sense amplifier also supplies a bit line voltage during the application of a program voltage in a program operation. The processor 312 controls the timing and magnitude of the bit line voltages.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line under control of processor 312. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the latch manager 482. In some embodiments, the processor 312 performs computations, such as to determine the data stored in the sensed memory cell. To make such computations, the latch manager 482 may provide the processor 312 with data (e.g., a bit) from the trip latch 468.

The managing circuit 360 comprises a latch manager 482, four example sets of data latches 484, 485, 486, 487 and an I/O Interface 488 coupled between the sets of data latches and data bus 332 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The latch manager 482 operates under control of the processor 312. The latch manager 482 may, however, perform some operations independent of control of the processor 312. In some embodiments, latch manager 482 is implemented in hardware, which may include but is not limited to discrete logic (e.g., XOR gates, AND gates, invertors, etc.). In some embodiments, the latch manager 482 performs computations, such as to determine the data stored in the sensed memory cell. In one embodiment, to determine the data stored in the sensed memory cell, the latch manager 482 may contain discrete logic, such as, but not limited to XOR gates. The latch manager 482 may also contain latches that may be used to store information to facilitate determining the data stored in the sensed memory cell. However, determining the data stored in the sensed memory cell using discrete logic may have limitations such as not being able to change a page mapping scheme. In some embodiments, using the processor 312 to determine the data in the memory cell allows the page mapping scheme to be changed. Further details of embodiments of changing a page mapping scheme are described below.

The determined data (whether determined by processor 312 or independently by latch manager 482) may be stored in the set of data latches. Each set of data latches 484-487 is used to store data bits determined during a read operation, and to store data bits imported from the data bus 332 during a program operation which represent write data meant to be programmed into the memory. I/O interface 488 provides an interface between data latches 484-487 and the data bus 332.

In one embodiment, the latch manager 482 is used to determine what voltage to apply to the bit line, based on the state of the latches. Thus, the latch manager 482 may perform some operations independent of processor 312, thus alleviating the need for the processor 312 to perform all computations and/or decisions.

During reading, the operation of the system is under the control of processor 312 that controls the supply of different control gate voltages to the addressed memory cell. As it steps through the various predefined control gate voltages corresponding to the various memory states supported by the memory, the sense circuitry 460 may trip at one of these voltages and a corresponding output will be provided from sense circuitry 460 to latch manager 482 via the data bus 454. At that point, in one embodiment, processor 312 determines the resultant memory state by consideration of the tripping event(s) of the sense circuitry 460 and the information about the applied control gate voltage. Processor 312 then computes a binary encoding for the memory state and stores the resultant data bits into data latches 484-487. In an alternative embodiment, the latch manager 482 determines the resultant memory state by consideration of the tripping event(s) of the sense circuitry 460 and the information about the applied control gate voltage from the processor 312 via input lines 490. In the alternative embodiment, latch manager 482 then computes a binary encoding for the memory state and stores the resultant data bits into data latches 484-487. In one such alternative embodiment, latch manager 482 has discrete logic for computing the binary encoding for the memory state. However, having the processor 312 compute the binary encoding for the memory state allows for greater design flexibility. For example, a page mapping scheme can easily be modified if the binary encoding is determined by the processor 312 by, for example, updating instructions that are executed on the processor 312.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the processor 312, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, latch manager 482 monitors the read back memory state relative to the desired memory state. When the two are in agreement, the latch manager 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5:
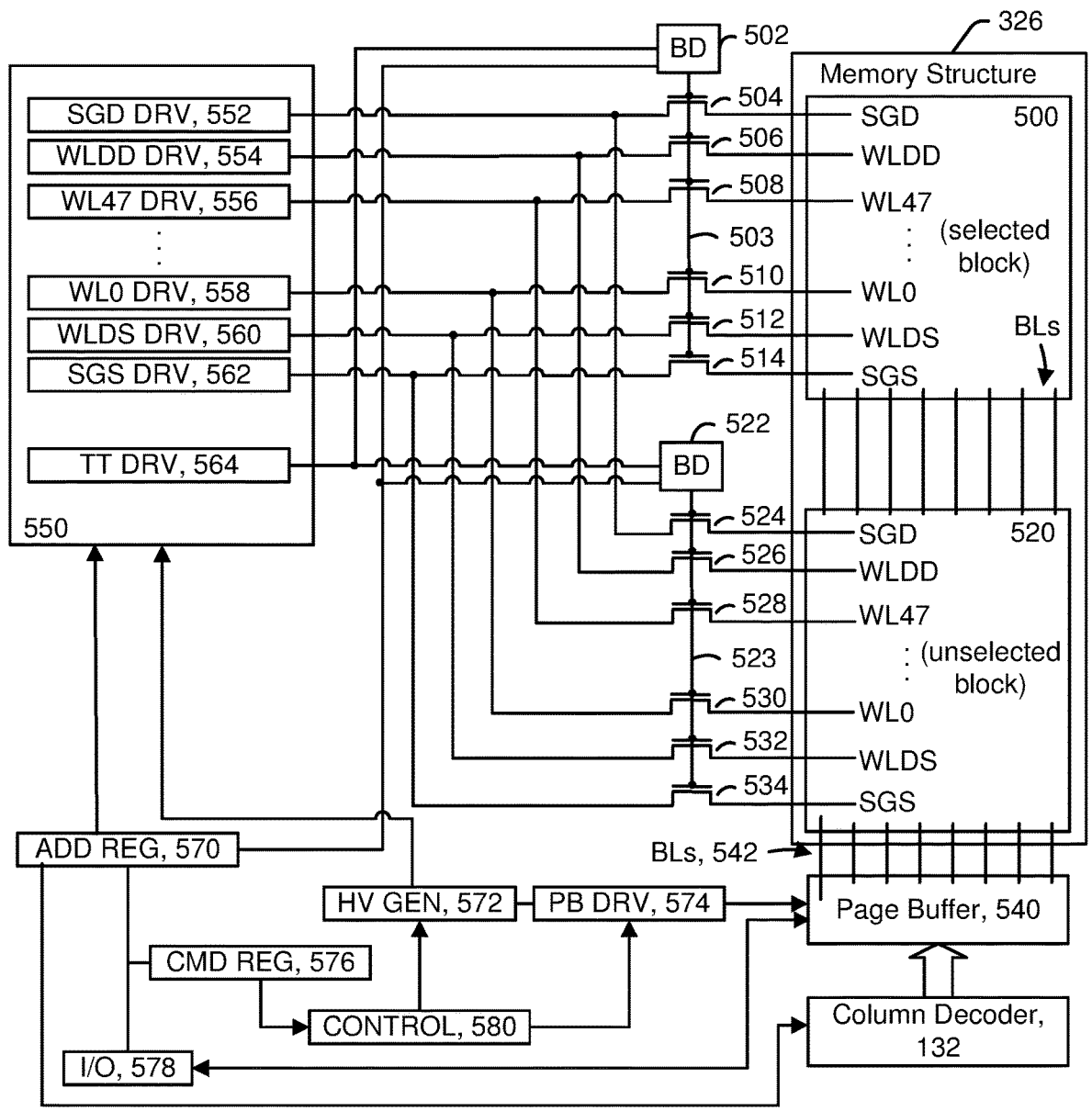
FIG. 5 is a diagram that shows further details of one embodiment of circuitry for applying voltages to a memory structure in a memory die.

FIG. 5 is a diagram that shows further details of one embodiment of circuitry for applying voltages to a memory structure 326 in a memory die 302. Two blocks 500, 520 of memory cells are depicted. These are two of many blocks in the memory structure 326. In one embodiment, the rest of the circuitry in FIG. 5 resides on the control die 304. However, some of the other circuitry could reside on the memory die 302. In one embodiment, the page buffer 540 resides on the memory die 302. In one embodiment, both the page buffer 540 and the column decoder 132 reside on the memory die 302.

The circuitry in FIG. 5 operates under control of processor 312. Circuits of FIG. 5 apply voltages to word lines, select lines, and bit lines. For example, the processor 312 may issue control signals to one or more of CONTROL 580, HV (High Voltage) GEN (Generator) 572, PB (Page Buffer) DRV (Driver) 574, CMD (Command) REG (Register) 576, I/O (Input/Output) Buffer 578. In one embodiment, the processor 312 issues control signals to CONTROL 580, which in turn controls other elements such as HV GEN 572 and PB DRV 574.

A high voltage generator (HV GEN) 572 is connected to the word line driver 550 and to page buffer drivers (PB DRV) 574. HV GEN 572 is one embodiment of voltage generators 370. The word line drivers 550 are controlled by the processor 312 to control magnitudes and timing of voltages to word lines and select lines in the memory structure 326, in one embodiment. PB DRV 574 is connected to page buffer 540 to control the page buffer 540. The page buffer 540 may include sense blocks, such as sense blocks 450 in FIG. 4. In one embodiment, the processor 312 controls the PB DRV 574 to control magnitude and timing of voltages applied to the bit lines (BLs) 542.

Each block of storage elements is associated with a set of transfer transistors, in one possible embodiment. For example, block 500, which is the selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL30-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514. The control gate of each transfer transistor of the block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, the BD 502 acts as a conductive switch which passes the voltage to the control gates of the associated transfer transistors via path 503. If the address does not match the address of the BD 502, the BD 502 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 550. Each driver may be provided a voltage from HV GEN 572. For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled by processor 312 to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, . . . , a transfer transistor 530 connected to WL0 and WL0 DRV 558, a transfer transistor 532 connected to WLDS and WLDS DRV 560, and a transfer transistor 534 connected to SGS and SGS DRV 562. The control gates of the transfer transistors of the unselected block 520 are connected to a respective block decoder (BD) 522 via a common path 523. The BD 522 is also connected to the TT DRV 564 to receive a voltage, and to the address register 570 to receive a control signal which instructs the BD 522 to pass or not pass the voltage to the control gates of the associated transfer transistors via path 523. The address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to a column decoder 132. The page buffers stores data which is written into, or read from, a selected word line of the selected block. During an operation of the memory device, the address register 570 provides a data load command to an input-output buffer 578 and to a command register 576. The input-output buffer 578 provides the command to the page buffer 540. The command register 576 provides a command to a control circuit 580, which instructs high voltage generator (HV GEN) 572 to control the voltage drivers 550 at appropriate levels. Typically, during programming, the driver of the selected word line provides a programming level voltage, such as 12-26 V while the unselected word lines receive a pass voltage VPASS such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. The control 580 also instructs the page buffer driver (PB DRV) 574 to control the page buffer 540. The address register 570 also communicates with the column decoder 132.

Figure 6:
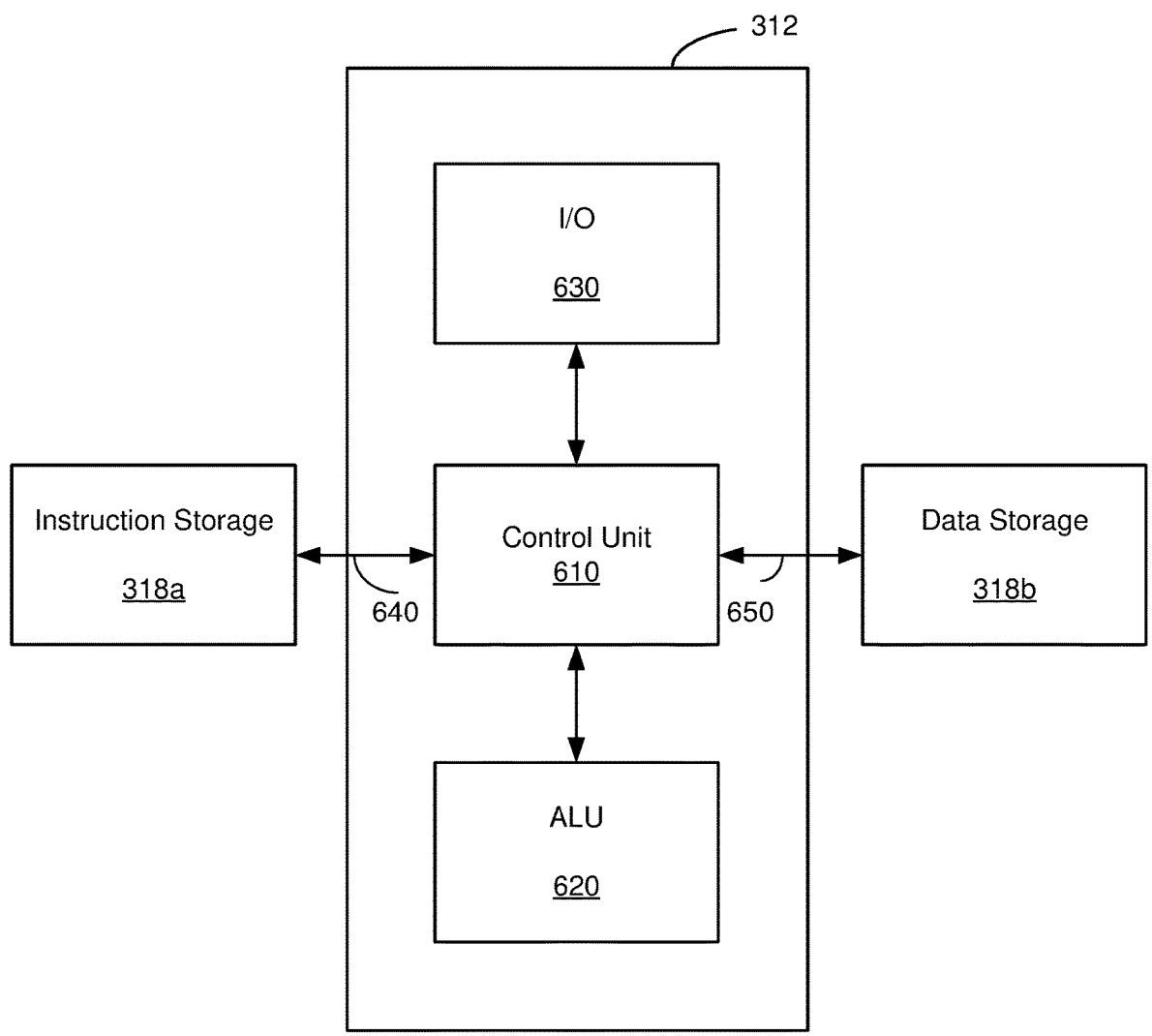
FIG. 6 is a diagram of one embodiment of a processor, connected to storage.

FIG. 6 is a diagram of one embodiment of a processor 312 on a control die 304. The processor 312 has a control unit 610, an arithmetic logic unit (ALU), and input/output (I/O) 630. In the embodiment in FIG. 6, the storage 318 is divided between instruction storage 318a and data storage 318b. There is one pathway 640 between the control unit 610 and the instruction storage 318a, and another pathway 650 between the control unit 610 and the data storage 318b. However, it is not required that there be a separate instruction storage 318a and data storage 318b. Also, it is not required that there be two pathways 640, 650. In one embodiment, there is a single pathway between the control unit 610 and storage 318.

In some embodiments, the control unit 610 contains an instruction register and a program counter. The program counter stores the address of a program instruction in instruction storage 318a. The control unit 610 may also contain instruction fetcher that is configured to fetch an instruction identified by the program counter from instruction storage 318a. The control unit 610 may also contain an instruction decoder that is configured to decode the instruction. The control unit 610 may also contain an instruction executer that is configured to execute the decoded instructions. The control unit 610 may also registers, which may be used for temporary storage of parameters.

The ALU 620 is used to perform arithmetic operations, such as determine voltage magnitudes to be applied to the memory structure 326. In one embodiment, the ALU performs arithmetic and bitwise operations on integer binary numbers. In one embodiment, the ALU 620 is a combinational digital electric circuit. For example, the ALU 620 may contain discrete logic such as AND gates, NAND gates, NOR gates, OR gates, XOR gates, etc. In some embodiments, the ALU 620 may be referred to as a processing unit.

In one embodiment, the input/output (I/O) 630 receives commands from the command interpreter 330. For example, the command interpreter 330 may send read, write (or program), erase or other commands to the I/O 630. The control unit 610 accesses and executes suitable instructions from instruction storage 318a for the command. The control unit 610 may also access various parameters and settings from the data storage 318b. The control unit 610 instructs the I/O 630 to issue control signals in order to control various circuits to effect the memory operation. The I/O 630 sends the control signals to circuits such as power control 316 and read/write circuits 328.

The processor 312 may have a wide variety of instruction set architectures. In some embodiments, the processor 312 has a RISC architecture. In one embodiment, the processor 312 has a RISC-V architecture. However, the processor 312 is not limited to a RISC architecture.

The processor 312 is programmable and reprogrammable. The processor 312 may be programmed by storing instructions into the instruction storage 318a, which are then executed in the processor 312. The processor 312 may be reprogrammed by updating, or otherwise modifying the instructions in the instruction storage 318a, which are then executed in the processor 312. In some embodiments, when the control die 304 is booted, program instructions are loaded from the memory structure storage region 336 to instruction storage 316a. Parameters and/or settings may be loaded from the memory structure storage region 336 to data storage 318a.

The elements in processor 312 may comprise, but are not limited to, one or more of a microprocessor, an electrical circuit, an application specific integrated circuit (ASIC), a Field Programmable Gate Array (FPGA), a digital logic circuit, an analog circuit, gates, flip flops, latches, RAM/ROM, and/or combinational logic.

Figure 7:
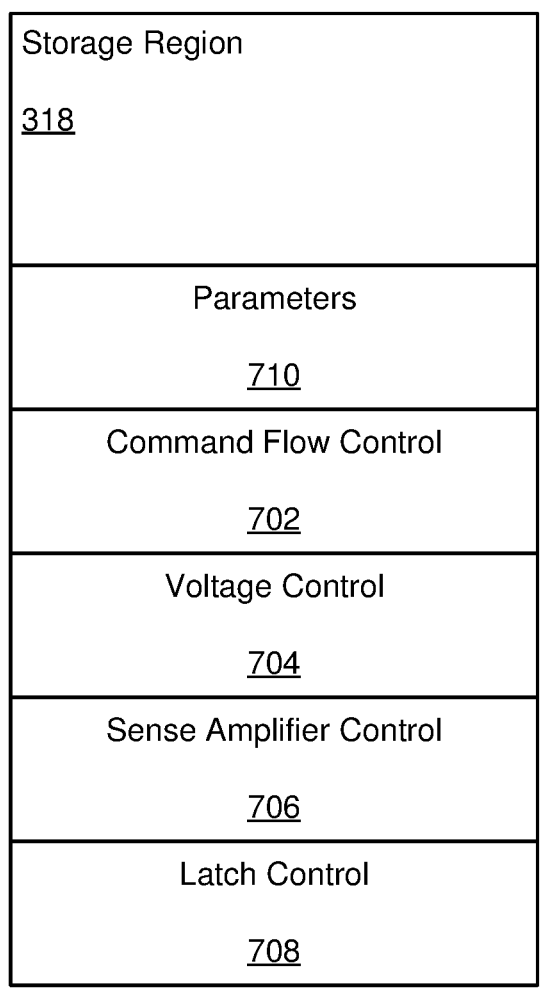
FIG. 7 is a diagram that shows various program modules that may be stored in storage region.

FIG. 7 is a diagram that shows various program modules that may be stored in storage region 318 (as well as in memory structure storage region 336). Some of the program modules contain program instructions, which are executed on processor 312. Some of the program modules contain program data (e.g. parameters), such as voltage magnitudes to be used to control the memory structure 326.

The command flow control program instructions 702 contains program instructions, which when executed on the processor 312, cause the processor 312 to control the overall flow of operation of the memory die 302. For example, the command flow control 702 contains instructions for controlling the flow of a program command. The flow control instructions may invoke other program instructions, such as the voltage control program instructions 704, sense amplifier control program instructions 706, latch control program instructions 708.

The voltage control program instructions 704, which when executed on the processor 312, cause the processor 312 to issue control signals to the power control 316. For example, the processor 312 may issue control signals to the voltage generators 370 to control timing and magnitudes of voltages applied to the memory structure 326. The parameters 710 may be accessed for voltage magnitudes. In some embodiments, the parameters 710 may be accessed for the timing of voltages. Therefore, the voltage control instructions 704 may be executed to control voltages applied to the memory structure 326.

The sense amplifier control program instructions 706, which when executed on the processor 312, cause the processor 312 to issue control signals to the sense amplifiers 350. The latch control program instructions 708, which when executed on the processor 312, cause the processor 312 to issue control signals to control the latches 354. In one embodiment, the processor 312 sends control signals to latch manager 482 in order to control the latches 354.

Figure 8A:
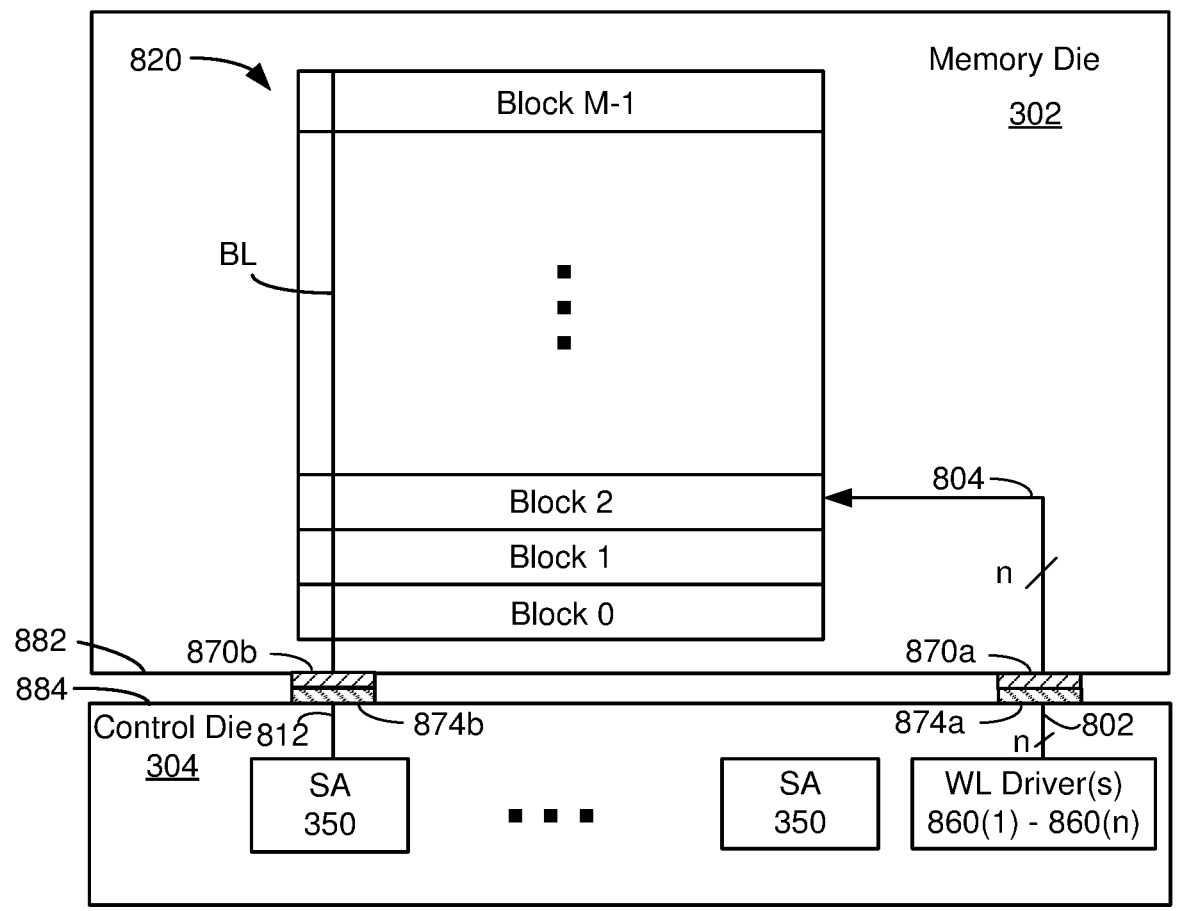
FIG. 8A is a block diagram of an embodiment of an integrated memory assembly.

FIG. 8A is a block diagram of one embodiment of an integrated memory assembly 104. FIG. 8A depicts further details of one embodiment of the integrated memory assembly 104 of FIG. 1A or 3A. Memory die 302 contains a plane 820 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 8A, Block 0 and Block M-1 of plane 820 are at the edges of the memory structure (or otherwise referred to as being located in an edge region/section of the memory structure).

In one embodiment, the control die 304 includes a number of sense amplifiers (SA) 350. In an alternative embodiment, the sense amplifiers (SA) 350 reside on the memory die 302. The processor 312 controls the sense amplifiers 350 (whether on the control die 304 or memory die 302). By updating the instructions and/or parameters used by the processor 312 the operation of the sense amplifier 350 can be modified. Each sense amplifier 350 is connected to one bit line, in this example. The sense amplifier contains a bit line driver, in one embodiment. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 860(1)-860(n). The word line drivers 860 are configured to provide voltages to word lines. In one embodiment, the word line drivers receive voltages from the voltage generator 370. In an embodiment, the processor 312 controls the voltage generator 370 and the word line drivers 860. By updating the instructions and/or parameters used by the processor 312 the operation of the voltage generator 370 and the word line drivers 860 can be modified. Therefore, the timing and/or magnitudes of voltages applied to the word lines can be modified.

In this example, there are "n" word lines per block of memory cells. In one embodiment, one of the blocks in the plane 820 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 860 provide voltages to the word lines in a first selected block (e.g., Block 2) in memory die 302. The control die 304 may also include charge pumps, voltage generators, and the like, which may be used to provide voltages for the word line drivers 860 and/or the bit line drivers.

The memory die 302 has a number of bond pads 870a, 870b on a first major surface 882 of memory die 302. There may be "n" bond pads 870a, to receive voltages from a corresponding "n" word line drivers 860(1)-860(n). There may be one bond pad 870b for each bit line associated with plane 820. The reference numeral 870 will be used to refer in general to bond pads on major surface 882.

In some embodiments, each data bit and each parity bit of a codeword are transferred through a different bond pad pair 870b, 874b. The bits of the codeword may be transferred in parallel over the bond pad pairs 870b, 874b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 874a, 874b on a first major surface 884 of control die 304. There may be "n" bond pads 874a, to deliver voltages from a corresponding "n" word line drivers 860(1)-860(n) to memory die 302a. There may be one bond pad 874b for each bit line associated with plane 820. The reference numeral 874 will be used to refer in general to bond pads on major surface 882. Note that there may be bond pad pairs 870a/874a and bond pad pairs 870b/874b. In some embodiments, bond pads 870 and/or 874 are flip-chip bond pads.

The pattern of bond pads 870 matches the pattern of bond pads 874, in one embodiment. Bond pads 870 are bonded (e.g., flip chip bonded) to bond pads 874, in one embodiment. Thus, the bond pads 870, 874 electrically and physically couple the memory die 302 to the control die 304. Also, the bond pads 870, 874 permit internal signal transfer between the memory die 302 and the control die 304. Thus, the memory die 302 and the control die 304 are bonded together. Although FIG. 8A depicts one control die 304 bonded to one memory die 302, in one embodiment, one control die 304 is bonded to two memory dies 302.

Herein, "internal signal transfer" means signal transfer between the control die 304 and the memory die 302. The internal signal transfer permits the circuitry on the control die 304 to control memory operations in the memory die 302. Therefore, the bond pads 870, 874 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 870, 874 may be formed for example of copper, aluminum and alloys thereof. There may be a liner between the bond pads 870, 874 and the major surfaces (882, 884). The liner may be formed for example of a titanium/titanium nitride stack. The bond pads 870, 874 and liner may be applied by vapor deposition and/or plating techniques. The bond pads and liners together may have a thickness of 720 nm, though this thickness may be larger or smaller in further embodiments.

Figure 10:
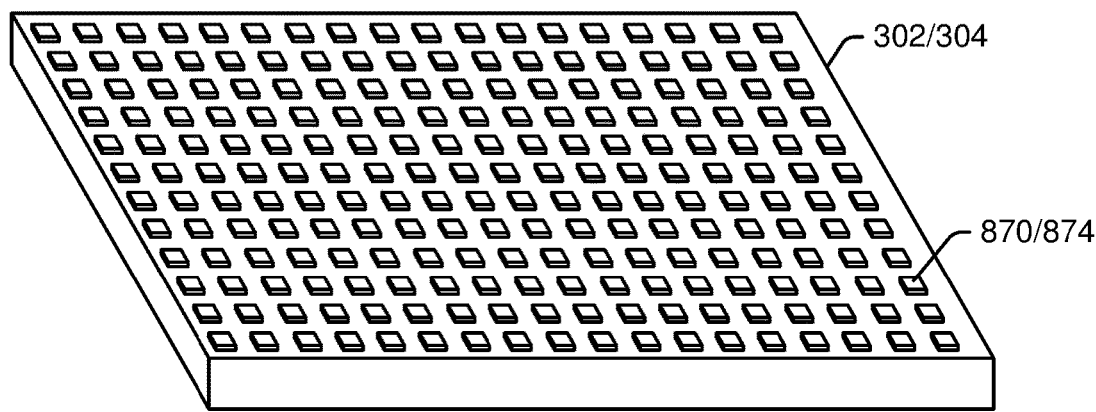
FIG. 10 depicts an example pattern of bond pads on a planar surface of a semiconductor die.

Metal interconnects and/or vias may be used to electrically connect various elements in the dies to the bond pads 870, 874. Several conductive pathways, which may be implemented with metal interconnects and/or vias are depicted. For example, a sense amplifier 350 may be electrically connected to bond pad 874b by pathway 812. There may be thousands of such sense amplifiers, pathways, and bond pads. Note that the BL does not necessarily make direct connection to bond pad 870b. The word line drivers 860 may be electrically connected to bond pads 874a by pathways 802. Note that pathways 802 may comprise a separate conductive pathway for each word line driver 860(1)-860(n). Likewise, there may be a separate bond pad 874a for each word line driver 860(1)-860(n). The word lines in block 2 of the memory die 302 may be electrically connected to bond pads 870a by pathways 804. In FIG. 8A, there are "n" pathways 804, for a corresponding "n" word lines in a block. There may be a separate pair of bond pads 870a, 874a for each pathway 804. FIG. 10A depicts further details of one embodiment of an integrated memory assembly 104 having metal interconnects and/or vias.

Figure 8B:
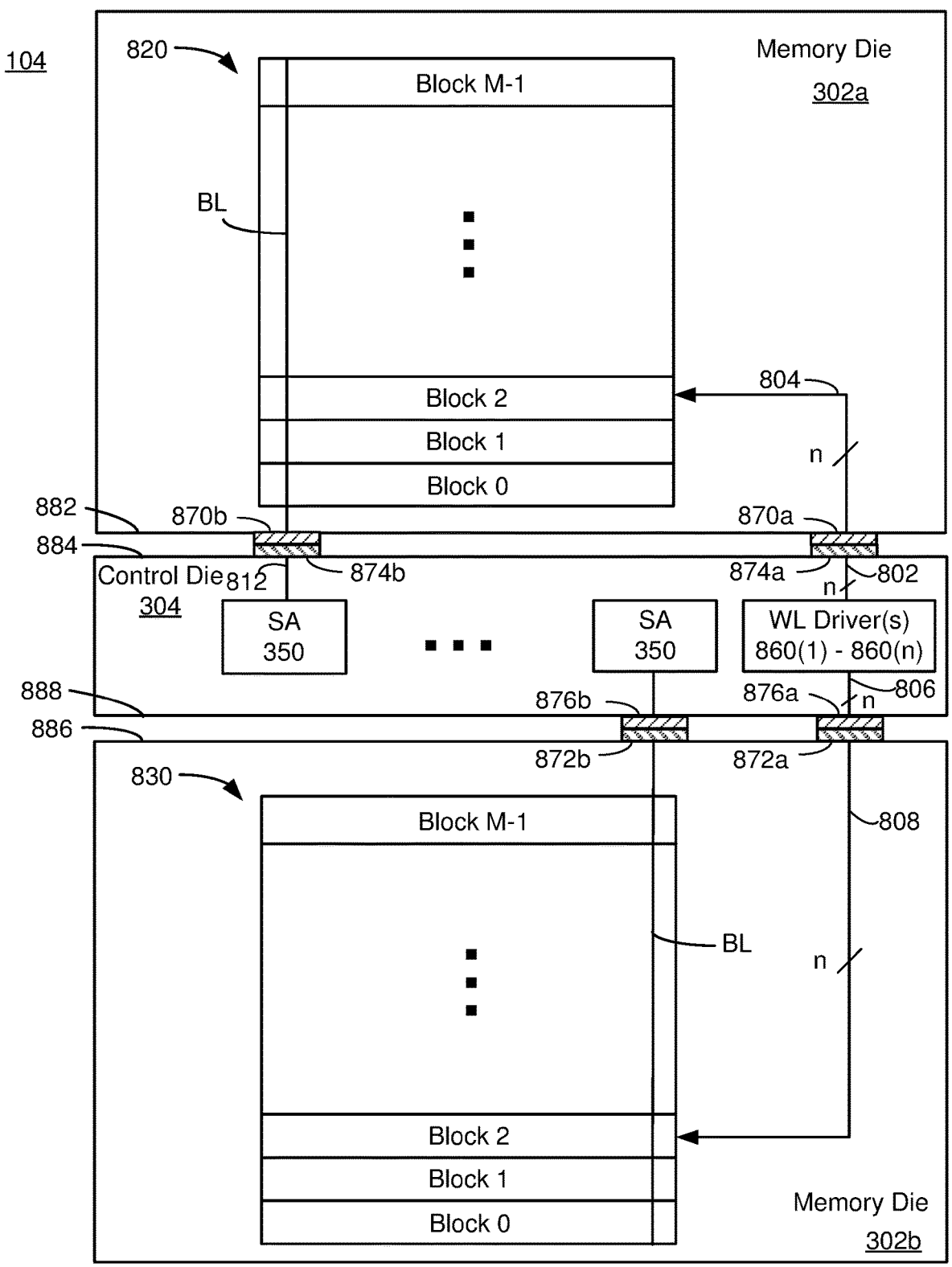
FIG. 8B is a block diagram of an embodiment of an integrated memory assembly in which a control die controls two memory dies.

FIG. 8B depicts another embodiment of an integrated memory assembly 104 in which one control die 304 may be used to control two memory die 302a, 302b. The control die 304 has a number of a number of bond pads 874(a), 874(b) on a first major surface 884, as discussed in connection with FIG. 8A. The control die 304 has a number of a number of bond pads 876(a), 876(b) on a second major surface 888. There may be "n" bond pads 876(a) to deliver voltages from a corresponding "n" word line drivers 860(1)-860(n) to memory die 302b. The word line drivers 860 may be electrically connected to bond pads 876a by pathways 806. There may be one bond pad 876b for each bit line associated with plane 830 on memory die 302b. The reference numeral 876 will be used to refer in general to bond pads on major surface 888.

The second memory die 302b has a number of bond pads 872a, 872b on a first major surface 886 of second memory die 302b. There may be "n" bond pads 872a, to receive voltages from a corresponding "n" word line drivers 860(1)-860(n). The word lines in plane 830 may be electrically connected to bond pads 872a by pathways 808. There may be one bond pad 872b for each bit line associated with plane 830. The reference numeral 872 will be used to refer in general to bond pads on major surface 886. Note that there may be bond pad pairs 872a/876a and bond pad pairs 872b/876b. In some embodiments, bond pads 872 and/or 876 are flip-chip bond pads.

In an embodiment, the "n" word line drivers 860(1)-860(n) are shared between the two memory die 302a, 302b. For example, a single word line driver may be used to provide a voltage to a word line in memory die 302a and to a word line in memory die 302b. However, it is not required that the word line drivers 860 are shared between the memory dies 302a, 302b.

Figure 9A:
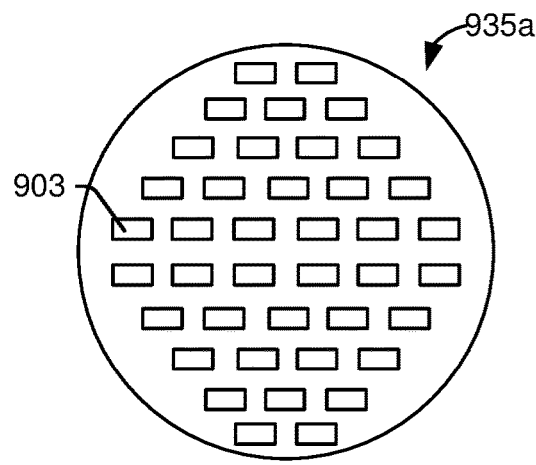
FIGS. 9A and 9B are top views of semiconductor wafers.

FIG. 9A is a top view of a semiconductor wafer 935a from which multiple control die 304 may be formed. The wafer 935a has numerous copies of integrated circuits 903. Each of the integrated circuits 903 contains the control circuitry 310 (see FIG. 3A), in one embodiment. The wafer 935a is diced into semiconductor dies, each containing one of the copies of the integrated circuits 903, in some embodiments. Therefore, numerous control semiconductor dies 304 may be formed from the wafer 935a. Also note that even before the wafer 935a is diced, as the term "control semiconductor die" is used herein, each region in which an integrated circuit 903 resides may be referred to as a control semiconductor die 304.

Figure 9B:
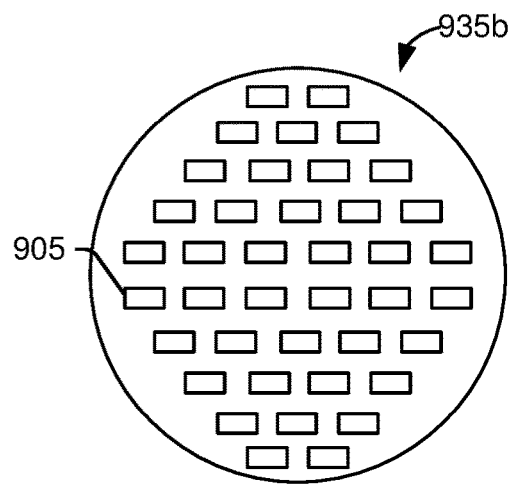

FIG. 9B is a top view of a semiconductor wafer 935b from which multiple memory die 302 may be formed. The wafer 935b has numerous copies of integrated circuits 905. Each of the integrated circuits 905 contains memory structure 326 (see FIG. 3A), in one embodiment. The wafer 935b is diced into semiconductor dies, each containing one of the copies of the integrated circuits 905, in some embodiments. Therefore, numerous memory semiconductor dies 302 may be formed from the wafer 935b. Also note that even before the wafer 935b is diced, as the term "memory semiconductor die" is used herein, each region in which an integrated circuit 905 resides may be referred to as a memory semiconductor die 302.

The semiconductor wafers 935 may start as an ingot of monocrystalline silicon grown according to either a CZ, FZ or other process. The semiconductor wafers 935 may be cut and polished on major surfaces to provide smooth surfaces. The integrated circuits 903, 905 may be formed on and/or in the major surfaces. The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

As has been briefly discussed above, the control die 304 and the memory die 302 may be bonded together. Bond pads on each die 302, 304 may be used to bond the two dies together. Recall that FIG. 8A depicts one example of bonds 870 on the memory die 302, as well as bonds 874 on the semiconductor die 304. FIG. 7 depicts an example pattern of bond pads on a planar surface of a semiconductor die. The semiconductor die could be memory die 302 or control die 304. The bond pads could be any of bond pads 870 or 874, as appropriate for the semiconductor die. There may be many more bond pads than are depicted in FIG. 7. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 870, 874 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11A:
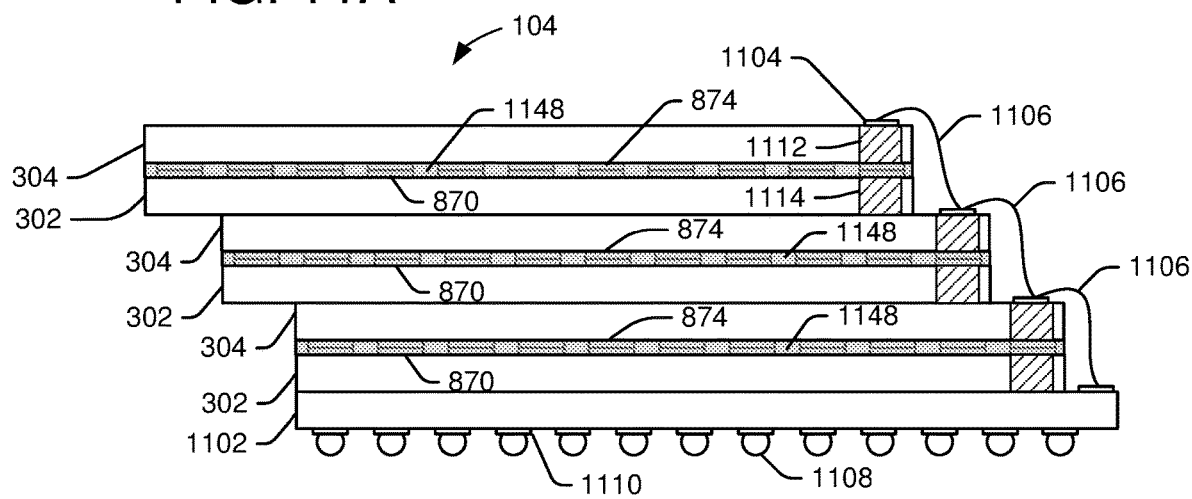
FIG. 11A depicts a side view of an embodiment of an integrated memory assembly stacked on a substrate.

As noted herein, there may be more than one control die 304 and more than one memory die 302 in an integrated memory assembly 104. In some embodiments, the integrated memory assembly 104 includes a stack of multiple control die 304 and multiple memory die 302. FIG. 11A depicts a side view of an embodiment of an integrated memory assembly 104 stacked on a substrate 1102. The integrated memory assembly 104 has three control die 304 and three memory die 302. Each control die 304 is bonded to one of the memory die 302. Some of the bond pads 870, 874, are depicted. There may be many more bond pads. A space between two dies 302, 304 that are bonded together is filled with a solid layer 1148, which may be formed from epoxy or other resin or polymer. This solid layer 1148 protects the electrical connections between the dies 302, 304, and further secures the dies together. Various materials may be used as solid layer 1148, but in embodiments, it may be Hysol epoxy resin from Henkel Corp., having offices in California, USA.

The integrated memory assembly 104 may for example be stacked with a stepped offset, leaving the bond pads 1104 at each level uncovered and accessible from above. Wire bonds 1106 connected to the bond pads 1104 connect the control die 304 to the substrate 1102. A number of such wire bonds may be formed across the width of each control die 304 (i.e., into the page of FIG. 11A).

A through silicon via (TSV) 1112 may be used to route signals through a control die 304. A through silicon via (TSV) 1114 may be used to route signals through a memory die 302. The TSVs 1112, 1114 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package. The solder balls 1108 may form a part of the interface between the integrated memory assembly 104 and the memory controller 102.

Figure 11B:
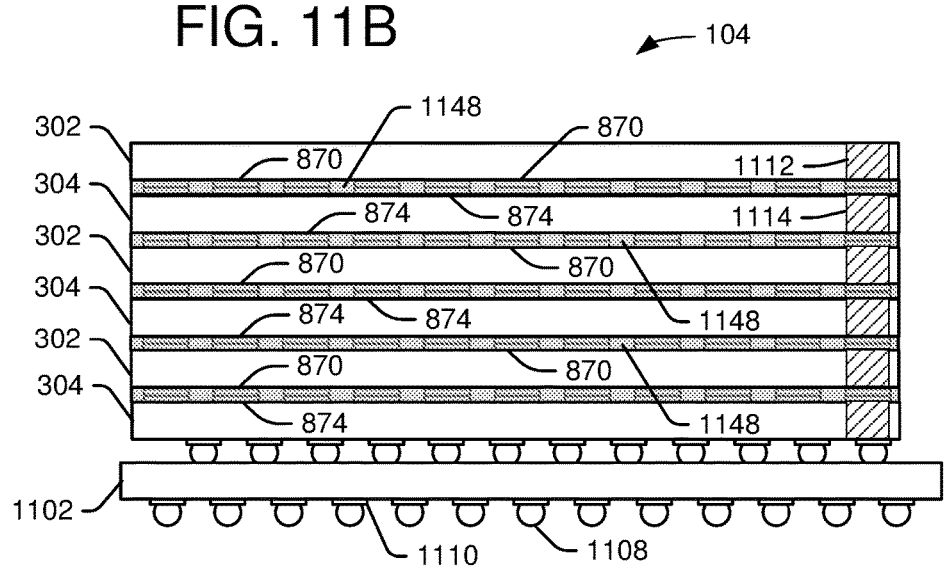
FIG. 11B depicts a side view of an embodiment of an integrated memory assembly stacked on a substrate.

FIG. 11B depicts a side view of an embodiment of an integrated memory assembly 104 stacked on a substrate 1102. The integrated memory assembly 104 has three control die 304 and three memory die 302. In this example, each control die 304 is bonded to at least one memory die 302. Optionally, a control die 304 may be bonded to two memory die 302. For example, two of the control die 304 are bonded to a memory die 302 above the control die 304 and a memory die 302 below the control die 304.

Some of the bond pads 870, 874 are depicted. There may be many more bond pads. A space between two dies 302, 304 that are bonded together is filled with a solid layer 1148, which may be formed from epoxy or other resin or polymer. In contrast to the example in FIG. 11A, the integrated memory assembly 104 in FIG. 11B does not have a stepped offset. A through silicon via (TSV) 1112 may be used to route signals through a memory die 302. A through silicon via (TSV) 1114 may be used to route signals through a control die 304.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package.

Figure 12:
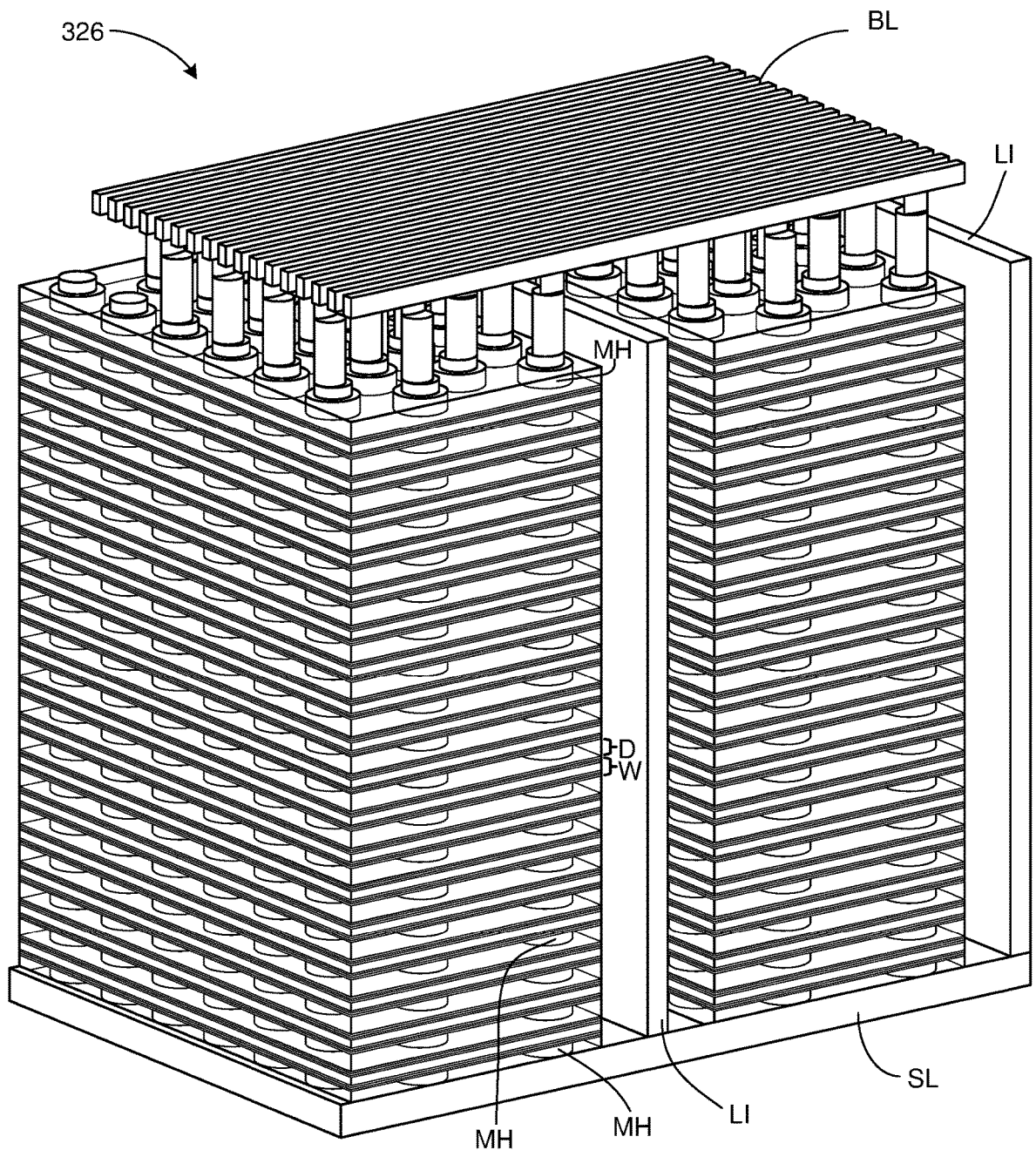
FIG. 12 is a perspective view of a portion of one example embodiment of a monolithic three dimensional memory array that can comprise memory structure.

FIG. 12 is a perspective view of a portion of one example embodiment of a monolithic three dimensional memory array that can comprise memory structure 326, which includes a plurality non-volatile memory cells. For example, FIG. 12 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 9, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 13A:
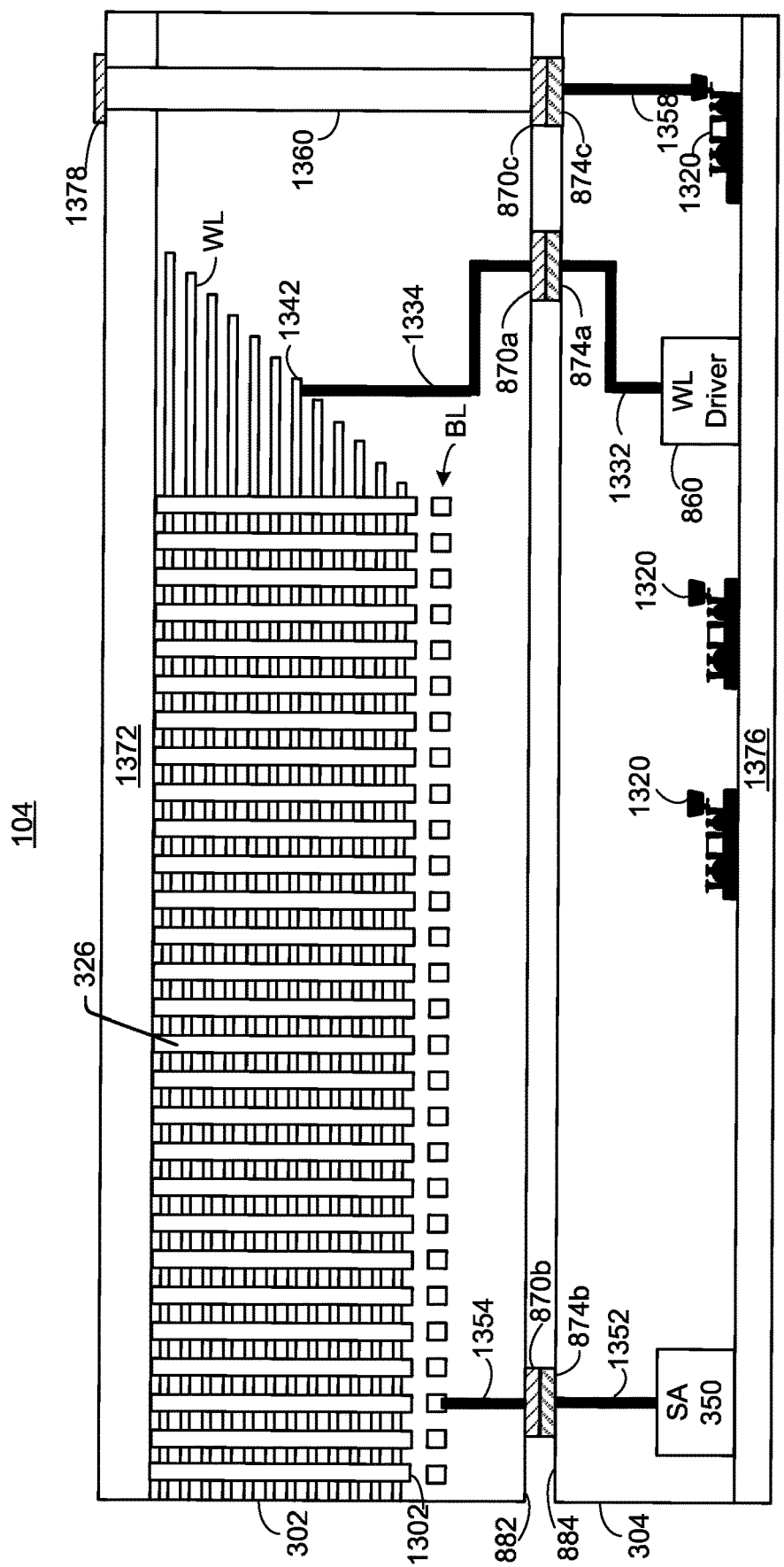
FIG. 13A is a diagram of one embodiment of an integrated memory assembly.

FIG. 13A is a diagram of one embodiment of an integrated memory assembly 104. In an embodiment depicted in FIG. 13A, memory die 302 is bonded to control die 304. This bonding configuration is similar to an embodiment depicted in FIG. 8A. Note that although a gap is depicted between the pairs of adjacent dies, such a gap may be filled with an epoxy or other resin or polymer. FIG. 13A shows additional details of one embodiment of pathways 352.

The memory die includes a memory structure 326. Memory structure 326 is adjacent to substrate 1372 of memory die 302. The substrate 1372 is formed from a portion of a silicon wafer, in some embodiments. In this example, the memory structure 326 include a three-dimensional memory array. The memory structure 326 has a similar structure as the example depicted in FIG. 12. There are a number of word line layers (WL), which are separated by dielectric layers. The dielectric layers are represented by gaps between the word line layers. Thus, the word line layers and dielectric layers form a stack. There may be many more word line layers than are depicted in FIG. 13A. As with the example of FIG. 12, there are a number of columns that extend through the stack. One column 1302 is referred to in each stack with reference numeral 1302. The columns contain memory cells. For example, each column may contain a NAND string. There are a number of bit lines (BL) adjacent to the stack.

Word line driver 860 concurrently provides voltages to a word line 1342 in memory die 302. The pathway from the word line driver 860 to the word line 1342 includes conductive pathway 1332, bond pad 874a, bond pad 870a, and conductive pathway 1334. In some embodiments, conductive pathways 1332, 1334 are referred to as a pathway pair. Conductive pathways 1332, 1334 may each include one or more vias (which may extend vertically with respect to the major surfaces of the die) and one or more metal interconnects (which may extend horizontally with respect to the major surfaces of the die). Conductive pathways 1332, 1334 may include transistors or other circuit elements. In one embodiment, the transistors may be used to, in effect, open or close the pathway. Other word line drivers (not depicted in FIG. 13A) provide voltages to other word lines. Thus, there are additional bond pad 874a, 870a in addition to bond pads 874a, 870a. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1352, bond pad 874b, bond pad 870b, and conductive pathway 1354. In some embodiments, conductive pathways 1352, 1354 are referred to as a pathway pair. Conductive pathways 1352, 1354 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1352, 1354 may include transistors or other circuit elements. In one embodiment, the transistors may be used to, in effect, open or close the pathway.

The control die 304 has a substrate 1376, which may be formed from a silicon wafer. The sense amplifiers 350, word line driver(s) 860, and other circuitry 1320 may be formed on and/or in the substrate 1376. The circuitry 1320 may include some or all of the control circuitry 310 (see FIG. 3A). In some embodiments, sense amplifiers 350, word line driver(s) 860, and/or other circuitry 1320 comprise CMOS circuits.

There is an external signal path that allows circuitry on the control die 304 to communicate with an entity external to the integrated memory assembly 104, such as memory controller 102. Therefore, circuitry 1320 on the control die 304 may communicate with, for example, memory controller 102 (see FIG. 3A). Optionally, circuitry on the control die 304 may communicate with, for example, host 120. The external pathway includes via 1358 in control die 304, bond pad 874c, bond pad 870c, through silicon via (TSV) 1360, and external pad 1378. The TSV 1360 extends through substrate 1372.

The TSV 1360, may be formed before, during or after formation of the integrated circuits in the semiconductor dies 302, 304. The TSV may be formed by etching holes through the wafers. For example, holes may be etched through substrate 1372. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to an embodiment depicted in FIG. 13A are possible. One modification is for sense amplifiers 350 to be located on memory die 302.

Figure 13B:
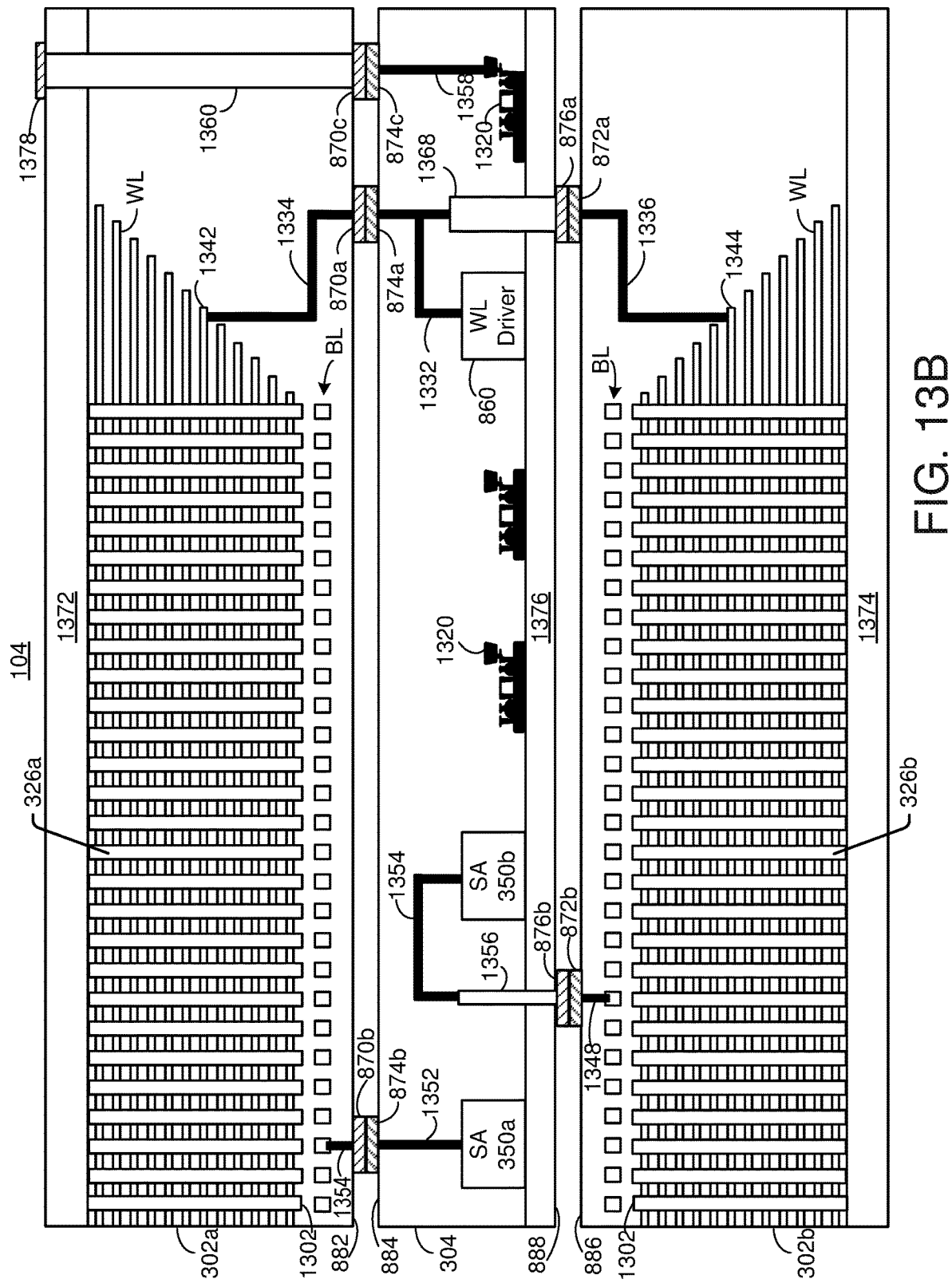
FIG. 13B is a diagram of one embodiment of an integrated memory assembly in which one control die controls two memory die.

FIG. 13B is a diagram of one embodiment of an integrated memory assembly 104. This bonding configuration is similar to an embodiment depicted in FIG. 8B. The configuration in FIG. 13B adds an extra memory die relative to the configuration in FIG. 13A. Hence, similar reference numerals are used for memory die 302a in FIG. 13B, as were used for memory die 302 in FIG. 13A. In an embodiment depicted in FIG. 13B, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1372 of memory die 302a. Memory structure 326b is adjacent to substrate 1374 of memory die 302b. The substrates 1372, 1374 are formed from a portion of a silicon wafer, in some embodiments. In this example, the memory structures 326 each include a three-dimensional memory array.

Word line driver 860 concurrently provides voltages to a first word line 1342 in memory die 302a and a second word line 1344 in memory die 302b. The pathway from the word line driver 860 to the second word line 1344 includes conductive pathway 1332, through silicon via (TSV) 1368, bond pad 876a, bond pad 872a, and conductive pathway 1336. Other word line drivers (not depicted in FIG. 13B) provide voltages to other word lines.

Sense amplifier 350a is in communication with a bit line in memory die 302a. The pathway from the sense amplifier 350a to the bit line includes conductive pathway 1352, bond pad 874b, bond pad 870b, and conductive pathway 1354. Sense amplifier 350b is in communication with a bit line in memory die 302b. The pathway from the sense amplifier 350b to the bit line includes conductive pathway 1354, TSV 1356, bond pad 876b, bond pad 872b, and conductive pathway 1348.

Numerous modification to an embodiment depicted in FIG. 13B are possible. One modification is for sense amplifiers 350a to be located on first memory die 302a, and for sense amplifiers 350b to be located on second memory die 302b.

Figure 14:
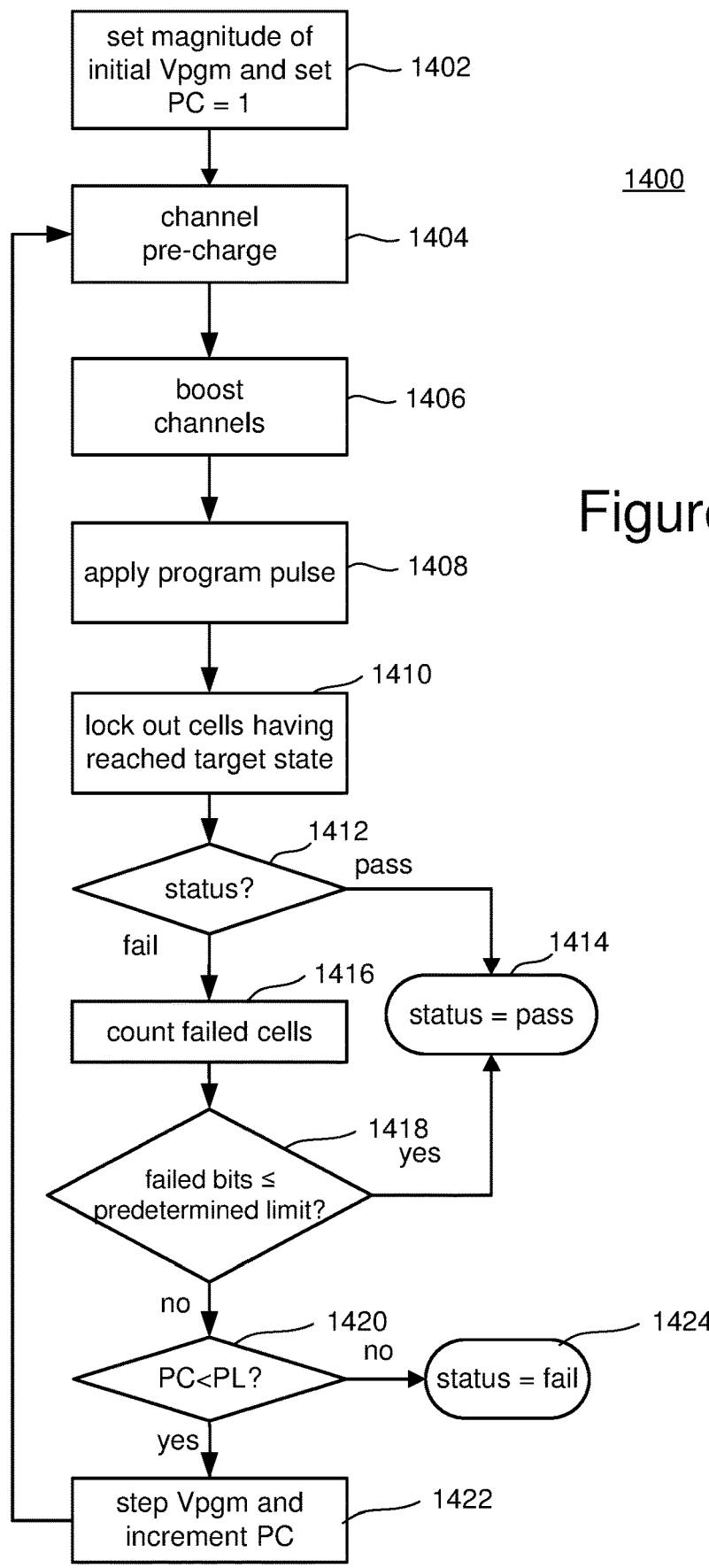
FIG. 14 is a flowchart describing one embodiment of a process for programming NAND strings of memory cells organized into an array.

FIG. 14 is a flowchart describing one embodiment of a process 1400 for programming NAND strings of memory cells organized into an array. In one example embodiment, the process of FIG. 14 is performed on integrated memory assembly 104 using the control circuitry 310 discussed above. For example, the process of FIG. 14 can be performed at the direction of processor 312. In one embodiment, the process flow can be modified by updating instructions that are updated by the processor 312.

In many implementations, the magnitude of the program pulses is increased with each successive pulse by a predetermined step size. In step 1402 of FIG. 14, the programming voltage (Vpgm) is initialized to the starting magnitude (e.g., ~12-16V or another suitable level) and a program counter PC maintained by processor 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1404 the memory system will pre-charge channels of NAND strings that include memory cells connected to the selected word line that are to be inhibited from programming.

In step 1406, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1408, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1408, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1410, memory cells that have reached their target states are locked out from further programming. Step 1410 may include performing verifying at one or more verify reference levels. In one embodiment, the verification process is performed by testing whether the threshold voltages of the memory cells selected for programming have reached the appropriate verify reference voltage.

In step 1410, a memory cell may be locked out after the memory cell has been verified (by a test of the Vt) that the memory cell has reached its target state.

If, in step 1412, it is determined that all of the memory cells have reached their target threshold voltages (pass), the programming process is complete and successful because all selected memory cells were programmed and verified to their target states. A status of "PASS" is reported in step 1414. Otherwise if, in step 1412, it is determined that not all of the memory cells have reached their target threshold voltages (fail), then the programming process continues to step 1416.

In step 1416, the memory system counts the number of memory cells that have not yet reached their respective target threshold voltage distribution. That is, the system counts the number of memory cells that have, so far, failed to reach their target state. This counting can be done by the processor 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1418, it is determined whether the count from step 1416 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1414. In this situation, enough memory cells programmed correctly such that the few remaining memory cells that have not been completely programmed can be corrected using ECC during the read process. In some embodiments, the predetermined limit used in step 1418 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1420 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1424. If the program counter PC is less than the program limit value PL, then the process continues at step 1422 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1422, the process loops back to step 1404 and another program pulse is applied to the selected word line so that another iteration (steps 1404-1422) of the programming process of FIG. 14 is performed.

Figure 15A:
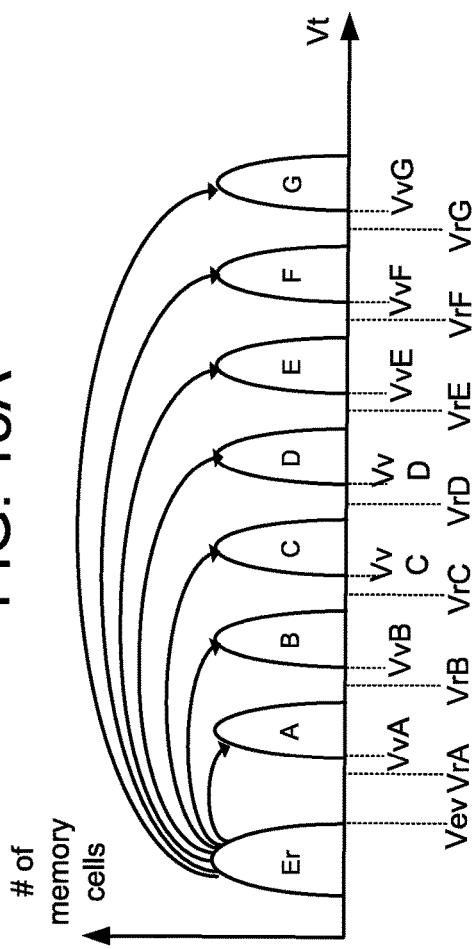
FIG. 15A illustrates example threshold voltage distributions for the memory array when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. FIG. 15A illustrates example threshold voltage distributions for the memory array when each memory cell stores three bits of data. Other embodiments, however, may use other data capacities per memory cell (e.g., such as one, two, four, or five bits of data per memory cell). FIG. 15A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 15A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 15A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 15A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 15A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 15A) or verify operation (e.g. see verify target levels VvA, VvB, VvC, VvD, VvE, VvF, and VvG of FIG. 15A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 15B:
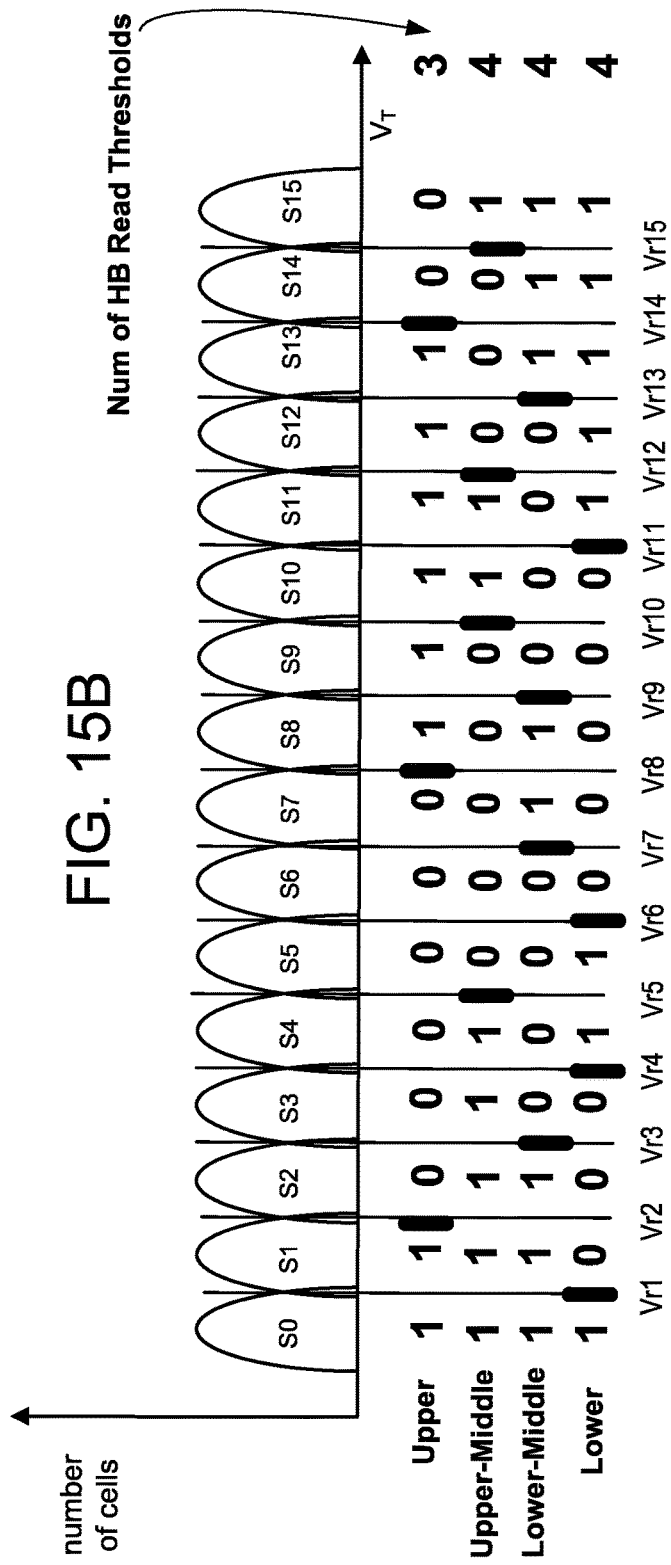
FIG. 15B depicts threshold voltage distributions and one embodiment of page mapping when each memory cell stores four bits of data.

FIG. 15B depicts threshold voltage distributions and one page mapping scheme when each memory cell stores four bits of data. FIG. 15B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible.

As noted, FIG. 15B depicts an example in which four bits are stored per memory cell. Thus, four pages may be stored in a set of memory cells. Fifteen read reference levels are depicted (Vr1-Vr15) The set of memory cells may be connected to the same word line. These pages may be referred to as a lower page, lower-middle page, upper-middle page, and upper page. In one embodiment, the memory cells may be sensed at Vr2, Vr8 and Vr14 to read the upper page. The memory cells may be sensed at Vr5, Vr5, Vr12, and Vr15 to read the upper-middle page. The memory cells may be sensed at Vr3, Vr7, Vr9, and Vr13 to read the lower-middle page. In order to read the lower page, the memory cells may be sensed at Vr1, Vr4, Vr6, and Vr11. In this page mapping scheme its take three reads for the upper page, four reads for the upper-middle page, four reads for the lower-middle page, and four reads for the lower page. This is referred to herein as type of a 3-4-4-4 page mapping scheme. Note that other 3-4-4-4 page mapping schemes may use other read reference levels.

Figure 15C:
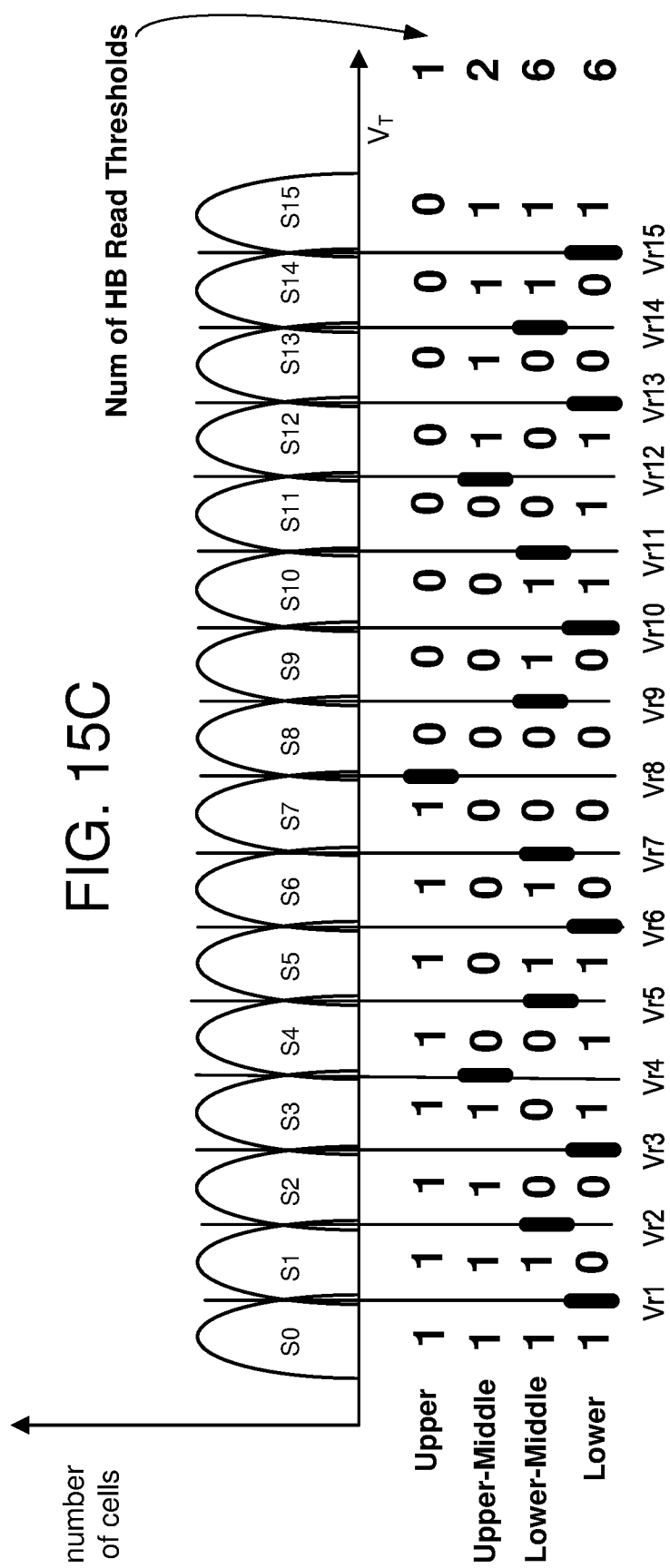
FIG. 15C depicts threshold voltage distributions and another embodiment of page mapping when each memory cell stores four bits of data.

Page mapping schemes may employ different number of reads for the different pages. Another page mapping scheme is a 1-2-6-6 scheme in which its take one read for the upper page, two reads for the upper-middle page, six reads for the lower-middle page, and six reads for the lower page. FIG. 15C depicts threshold voltage distributions and a 1-2-6-6 page mapping scheme when each memory cell stores four bits of data. In one embodiment, the memory cells may be sensed at Vr8 to read the upper page. The memory cells may be sensed at Vr4 and Vr12 to read the upper-middle page. The memory cells may be sensed at Vr2, Vr5, Vr7, Vr9, Vr11 and Vr14 to read the lower-middle page. In order to read the lower page, the memory cells may be sensed at Vr1, Vr3, Vr6, Vr10, Vr13 and Vr15. In both of the 3-4-4-4 and 1-2-6-6 page mapping schemes, 15 reads are performed (one at each of Vr1-Vr15).

Figure 16:
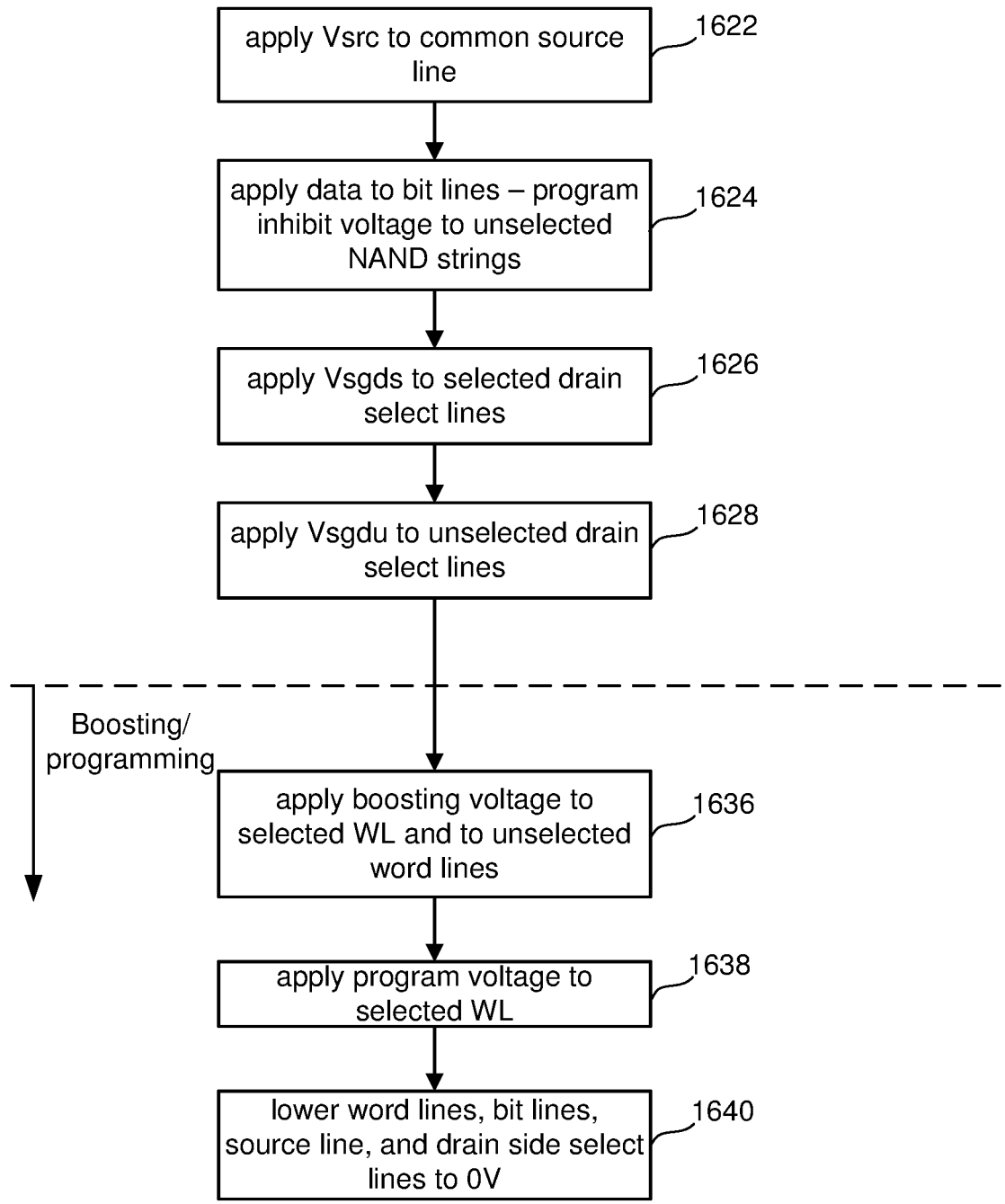
FIG. 16 is a flowchart of one embodiment details of programming non-volatile storage during step 1408 of FIG. 14.
Figure 17:
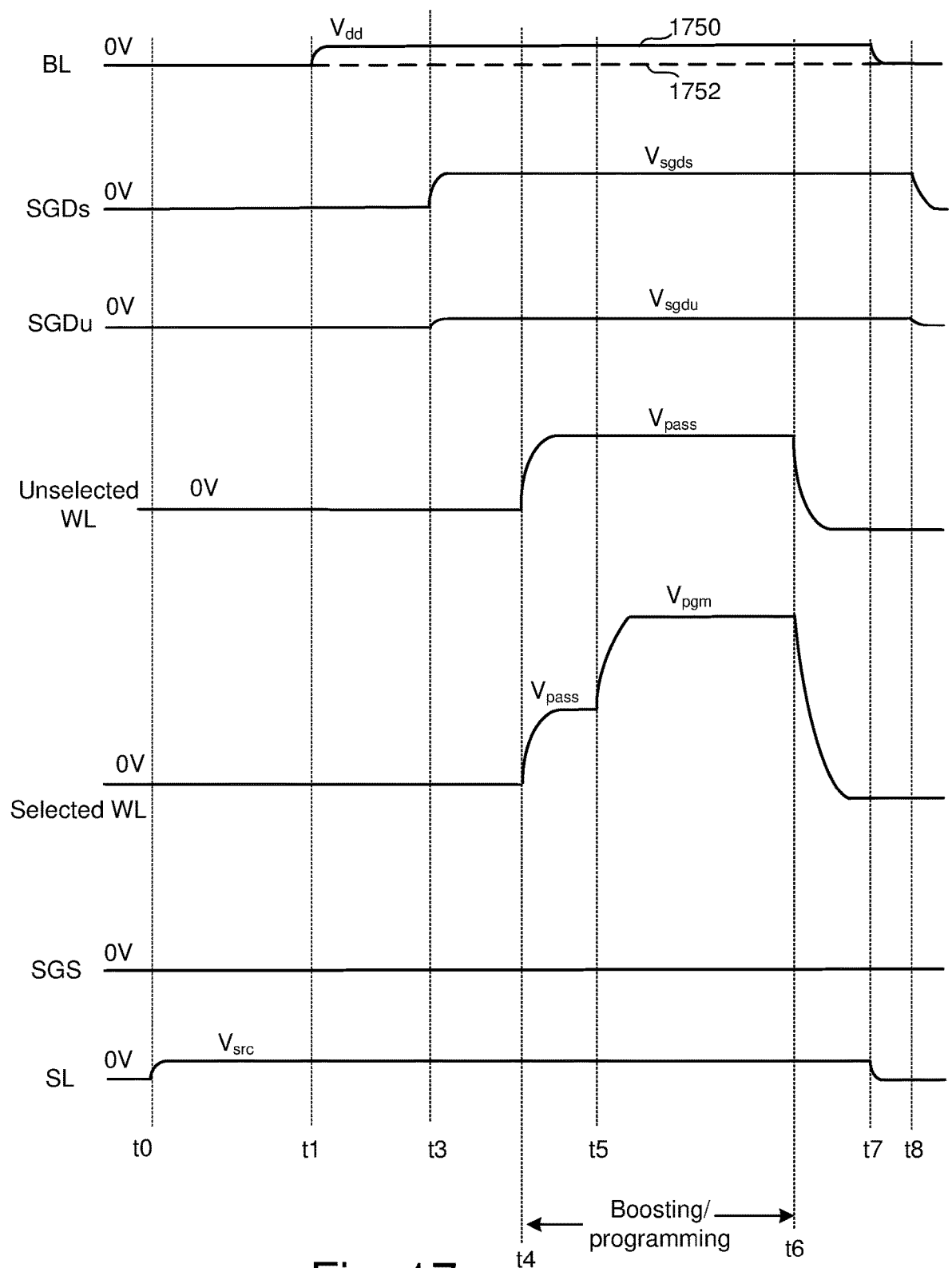
FIG. 17 shows timing of various signals during one embodiment of the process of FIG. 16.

As noted herein, the processor 312 may control timing and/or magnitudes of voltages applied to control lines in a memory structure 326 on the memory die 302. FIGS. 16 and 17 will be used to illustrate timing and magnitudes of voltages applied to control lines in the memory structure 326 during a program operation. FIG. 16 depicts a flowchart of one embodiment of applying a program pulse and programming voltages that may be used in step 1408 of FIG. 14. This process is used to program 3D NAND in one embodiment. FIG. 17 shows timing of various signals during one embodiment of the process of FIG. 16. The processor 312 controls the timing and magnitudes of the signals in FIG. 17, in one embodiment. Note that the various signals in FIG. 17 are just one example of voltages applied to the memory structure 326 during a memory operation.

A low voltage is applied to the source line at step 1622. Referring to FIG. 17, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 17 are at 0V at time t0.

At step 1624, the data is applied to the bit lines. In one embodiment, the processor 312 controls the sense amplifiers 350 to apply the data to the bit lines. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 17, line 1752 shows the bit line voltage at 0V for a NAND string (in the set that are a part of the present programming operation) having a memory cell at the selected word line WLn that is to be programmed. Line 1750 shows the bit line voltage at $V_{DD}$ for a NAND string (in the set that are a part of the present programming operation) having a cell at WLn that is to be inhibited from programming. $V_{DD}$ designates program inhibit and is often referred to as a program inhibit voltage. Note that line 1752 represents one example of V_Program_Enable, and that line 1750 represents one example of Vbl_Inhibit.

Step 1626 is to apply Vsgds to selected drain side select lines. Step 1628 is to apply Vsgdu to unselected drain side select lines. Note that FIG. 17 shows two SGD lines. Line SGDs refers to a drain side select line having at least one NAND string that is currently programming. Line SGDu refers to a drain side select line having no NAND strings currently programming.

Referring to FIG. 17, at time t3, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time $t_3$.

Note that at this time Vsgds may also be applied to control gates of drain side select transistors of NAND strings for which no memory cell should be programmed. However, note that Vbl_Inhibit is being applied to the unselected bit line BL1 at time $t_3$.

Referring again to FIG. 17, at time $t_3$, drain side select line SGDu is set to Vsgdu. The voltage Vsgdu should keep off the associated drain side select transistor.

At step 1636, a boosting voltage (e.g., $V_{PASS}$) is applied to unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 17, at time $t_4$, the boosting/programming phase begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 1638. With the boosting voltages applied and the inhibited NAND string channels boosted, program disturb of unselected memory cells on the selected word line is prevented or reduced.

Referring to FIG. 17, at time $t_5$, the program voltage $V_{PGM}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 1640, the word lines, bit lines, source lines, and drain select lines are lowered to 0V, marking the completion of one programming iteration. It should be noted that the steps of FIG. 16 can be applied with each iteration of the process of FIG. 14, with the program voltage being increased each iteration. However, it is not required that the program voltage increase in magnitude with each iteration.

Referring to FIG. 17, at time t6, the word lines are lowered to 0V. The source and bit lines are then lowered to 0V at time t7. The drain select line SGD is lowered to 0V at time t8.

Numerous variations to the signals depicted in FIG. 17 can be made in accordance with embodiments. Also note that timing and/or magnitudes of the signals in FIG. 17 can be modified by modifying instructions executed by the processor 312. For example, if it is determined that the length of time for which the programming voltage is applied should be changed, then the instructions can be modified to change the length of time between t5 and t6 in the program voltage on the selected word line of FIG. 7. Many other modifications to the timing and/or magnitudes of voltages applied to the word lines, bit lines and select lines can be made by modifying instructions executed by the processor 312 and/or by modifying data that the processor 312 uses when executing the instructions. Such changes may be impractical in a system that uses a hard-wired state machine to control the timing and magnitudes of voltages applied to control lines in the memory structure 326.

Figure 18:
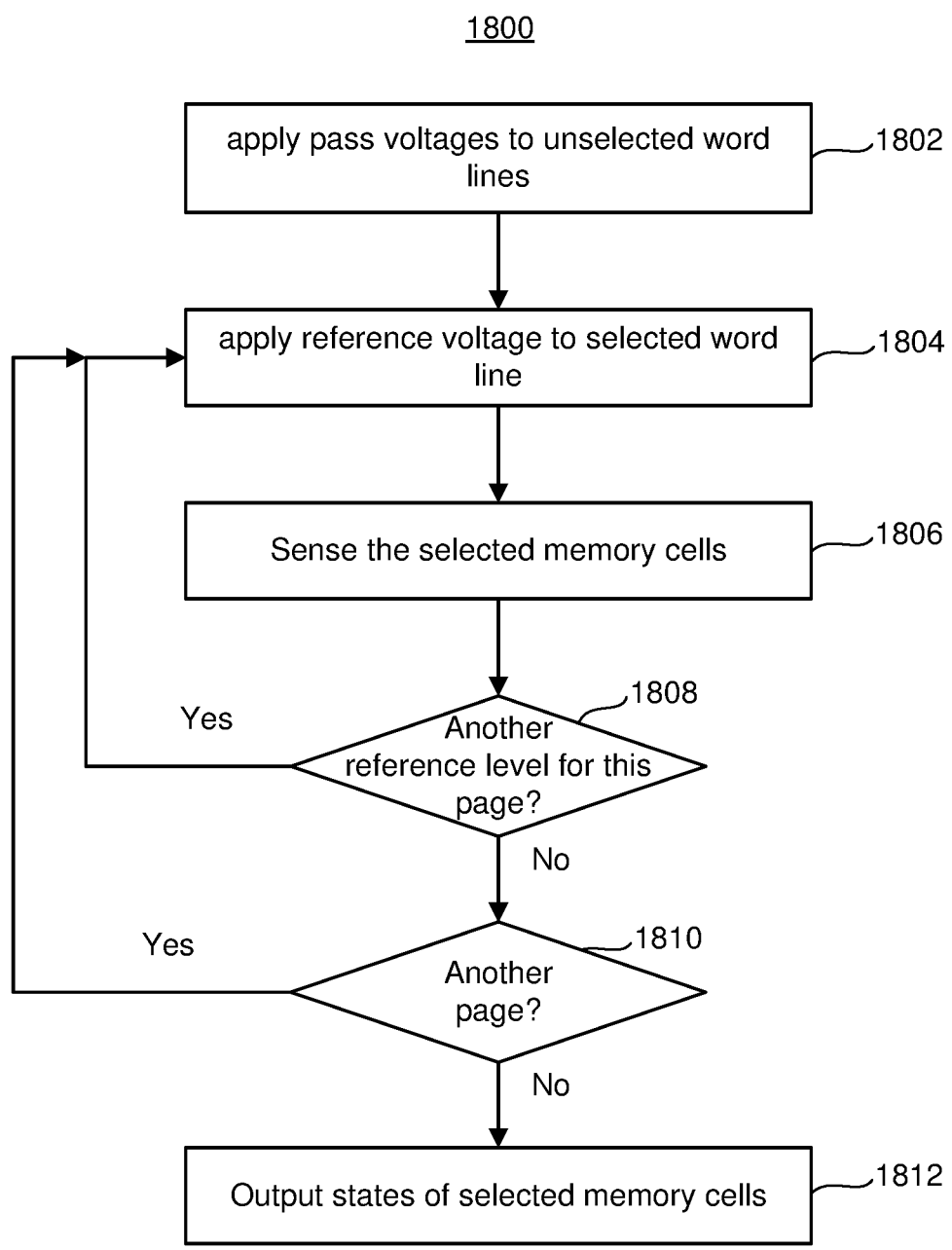
FIG. 18 is a flow chart describing one embodiment of a process for reading data from non-volatile memory cells.

FIG. 18 is a flow chart describing a sensing operation performed in order to read data from the memory cells. The process may be performed under control of the processor 312. The process 1800 can be used to read multiple pages of data from a set of memory cells.

In step 1802, a pass voltage is applied to unselected word lines so that unselected memory cells on a NAND string are conducting, which enables the system to test whether the selected memory cell conducts in response to the read reference voltage. This pass voltage is often referred to as Vread. In step 1804, the appropriate read reference voltage, also referred to as Vcgr, is applied to the selected word line. An example will be provided of reading the lower page using the page mapping scheme in FIG. 15B. Thus, the reference voltage is Vr1 in the first iteration of process 1800, in this example.

Step 1806 includes sensing the selected memory cells. In one embodiment, the trip latch 468 in the sense amplifier 350 connected to the bit line for one of the selected memory cells may trip in response to the reference voltage applied to the selected word line. A corresponding output will be provided from the sense amplifier 350 to the latch manager 482 by way of the data bus 454. In one embodiment, the processor 312 is notified when the memory cell trips.

In some embodiments, sensing in step 1806 includes the following. In one example embodiment, a capacitor in the sense amplifier is charged up. The bit line is connected to the capacitor to allow the bit line to discharge the capacitor in response to the reference voltage in step 1804. After a predetermined time period, referred to as the "integration time" or "strobe time" the voltage of the capacitor is sampled to see whether the respective memory cell(s) conducted. If the memory cell conducts in response to Vcgr, the trip latch 468 trips, indicating that the threshold voltage of the memory cell is less than Vcgr. There are many other techniques for sensing a memory cell.

Step 1808 is a determination of whether there is another reference level to apply to the selected word line for this page. In the current example, the process will repeat by applying Vr4 at step 1804. Again, a determination will be made whether the memory cells trip in response to the reference voltage applied to the selected word line. The process 1800 will perform step 1804 two more times to apply Vr6 and Vr11 to the selected word line in order to be able to determine the lower page data.

Based on the reference level when the trip latch 468 in the sense amplifier 350 trips, the processor 312 may determine the lower page data (or another page with suitable reference levels) of the selected memory cell. In an alternative embodiment, the latch manager 482 determines the lower page data of the selected memory cell. For example, the latch manager 482 may contain discrete logic to determine the lower page data. As one example, the latch manager 482 performs a series of XOR operations based on the results from the trip latch 468 to determine the lower page data. Using discrete logic to determine the lower page data (as well as other data pages) makes it difficult to modify the page mapping scheme. However, by having the processor 312 determine the data, the page mapping scheme may be modified by updating program instructions that are executed by the processor 312.

In one embodiment, the lower page data is stored in the LDL latches (see FIG. 4). In one embodiment, the processor 312 controls the latch manager 482 in order to store the results in the LDL latches. Hence, the processor 312 may control latch operations.

Steps 1804-1806 are then repeated if there is another page to read (step 1810). For example, the lower-middle page can be sensed by sensing at Vr3, Vr7, Vr9, and Vr13 (see FIG. 15B). The upper-middle and upper pages can be sensed in a similar manner.

In step 1812, states of the respective memory cells are output. Stated another way the page data is output. For example, the contents of the LDL, LMDL, UMDL, and UDL latches may be output by way of the I/O interface 488. In this example, four pages of data are output. Thus, the data may be provided from control die 304 to the memory controller 102.

Figure 19:
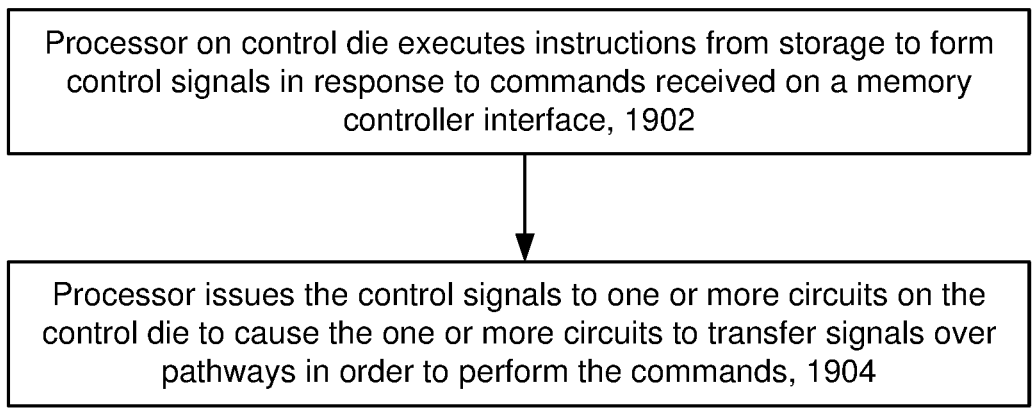
FIG. 19 is a flowchart of one embodiment of a process of a processor on a control die controlling operation of a memory die.

FIG. 19 is a flowchart of one embodiment of a process of a processor 312 on a control die 304 controlling operation of a memory die 302. The process may be performed by the control die 304 in response to receiving commands from the memory controller 102.

Step 1902 includes the processor 312 on the control die 304 executing instructions from storage 318 to form control signals in response to commands received on a memory controller interface 334. The commands are provided by memory controller 102. The commands include commands to access non-volatile memory cells in the memory structure 326 of the memory die 302. The commands may include, but are not limited to, read, program, and erase commands.

Step 1904 includes the processor 312 on the control die 304 issuing the control signals to one or more circuits on the control die 304 to cause the one or more circuits to transfer signals over pathways 352 in order to perform the commands. The one or more circuits may include, but are not limited to, read/write circuits 328, power control 316, address decoders 314, sense amplifiers 350, managing circuit 360, latches 354, voltage generators 370, latch manager 482, HV GEN 572, word line drivers 550, and/or page buffer (PB) drivers 574.

In step 1904, the processor 312 may execute instructions from the storage 318 to issue a set of control signals to the voltage generators 370 to apply voltages to the memory structure 326 by way of pathways in the control die 304 and pathways in the memory die 302. For example, with respect to FIGS. 3B and 13A, the processor 312 may control the voltage generators 370 and the WL driver 860 to provide voltages to the word lines (WL) in memory structure 326. The voltages may be provided from WL driver 860 through pathway 1332 to pathway 1334 (passing through bond pads 874a, 870a).

In step 1904, the processor 312 may execute instructions from the storage 318 to issue a set of control signals to sensing circuits 450 to sense conditions of non-volatile memory cells in the memory structure 326 by way of pathways in the control die 304 and pathways in the memory die 302. For example, with respect to FIGS. 3B and 13A, the processor 312 may control the read/write circuit 328 (which includes the sense amplifiers 350) to sense the bit lines (BL) in memory structure 326. A signal from the bit line may be sensed through pathway 1354 to pathway 1352 (passing through bond pads 870b, 874b).

In step 1904, the processor 312 may execute instructions from the storage 318 to issue a set of control signals to sensing circuits 450 to control operation of the data latches 354 in order to transfer data to or from non-volatile memory cells in the memory structure 326 by way of pathways in the control die 304 and pathways in the memory die 302. For example, with respect to FIGS. 3B, 4, and 13A, the processor 312 may control the read/write circuit 328 (which includes the latches 354) to sense the bit lines and store data into the latches 354. The processor 312 may control the read/write circuit 328 (which includes the latches 354) to program data in the latches 354 into the memory cells. As has been discussed above, the data from the latches 354 may be used to set a voltage on the bit line during programming in order to program the data. A signal to or from the bit line may travel through pathway 1354 to pathway 1352 (passing through bond pads 870b, 874b).

Embodiments of a memory system 100 have a processor 312, which is programmable and may be reprogrammed. Features can be added and functionality can be changed by updating the instructions that are executed by the processor 312.

Figure 20:
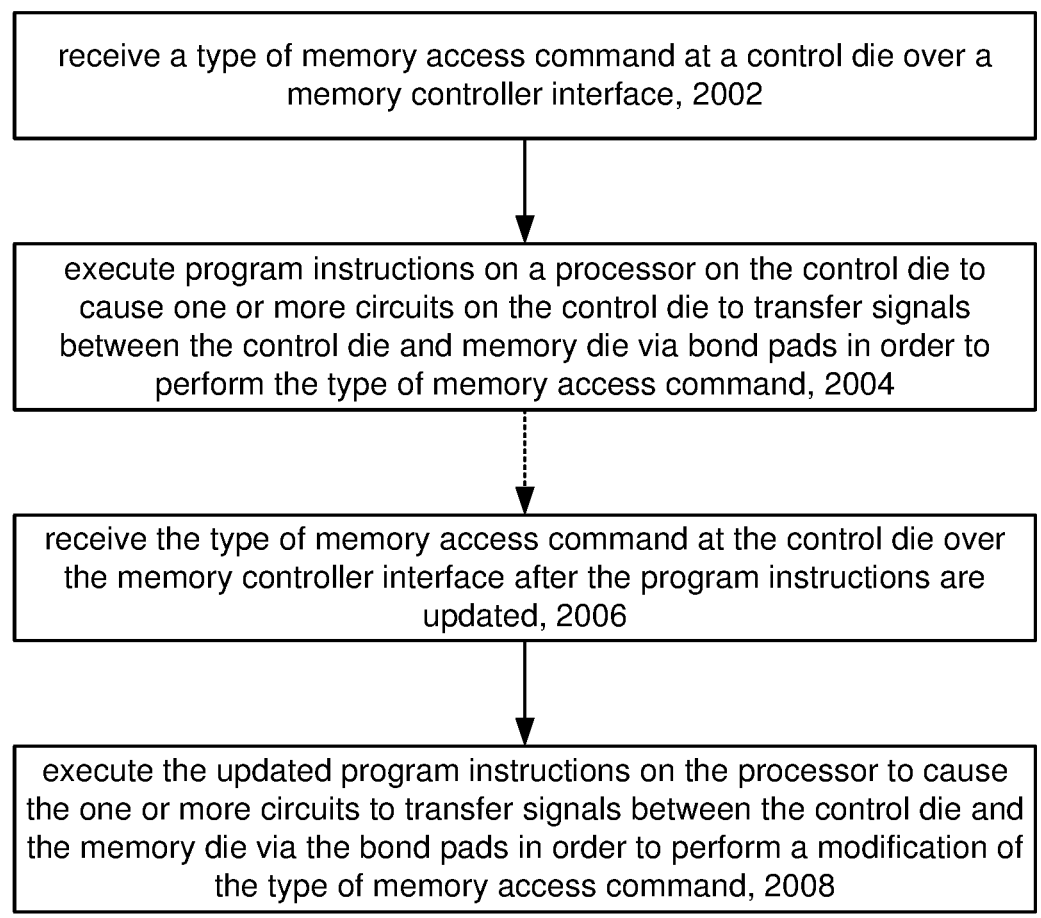
FIG. 20 is a flowchart of one embodiment of a process of modifying a type of memory access command by updating instructions executed by processor.

FIG. 20 is a flowchart of one embodiment of a process of modifying a type of memory access command by updating instructions executed by processor 312. Step 2002 includes receiving a type of memory access command at a control die 304 over a memory controller interface 334. As discussed herein, the control semiconductor die 304 is bonded to a memory die 302 by way of bond pads. The type of memory access command may include, but is not limited to, read, program, and erase. Moreover, there may be multiple types of read, program, and erase commands. For example, there can be different modes of program, which can be considered to be different types of program commands. For example, one program mode is to program memory cells at one bit per memory cell, another program mode is to program memory cells at four bits per memory cell.

Step 2004 includes executing program instructions on a processor 312 on the control semiconductor die 304 to cause one or more circuits to transfer signals between the control semiconductor die 304 and the memory semiconductor die 302 by way of the bond pads in order to perform the type of memory access command on a set of non-volatile memory cells on the memory die 302. The signals that are transferred may include voltages to control lines (e.g., word lines, select lines, bit lines). The signals that are transferred may include data sent to bit lines, or sensed from a bit line.

The one or more circuits may include, but are not limited to, read/write circuits 328, power control 316, address decoders 314, sense amplifiers 350, managing circuit 360, latches 354, voltage generators 370, latch manager 482, HV GEN 572, word line drivers 550, and/or page buffer (PB) drivers 574.

Step 2006 includes receiving the type of memory access command at the control semiconductor die 304 over the memory controller interface 334 after the program instructions are updated. For example, if the type of memory access command in step 2002 was to program memory cells at four-bits per memory cell, then this type of command is again received. The arrow between step 2004 and 2006 is dashed to indicate that some time may pass between these steps. Also, the memory system 100 may be re-booted between these steps. Updating the program instructions may include the memory controller 102 sending instruction updates to the control die 304, which stores the updated instructions. The updated program instructions may replace a portion, or all, of the instructions in storage region 318 and/or storage region 336. In some embodiments, the host 120 provides the updated program instructions to the memory controller 102.

Step 2008 includes executing the updated program instructions on the processor 312 on the control semiconductor die 304 to cause the one or more circuits to transfer signals between the semiconductor die 304 and the memory die 302 by way of the bond pads in order to perform a modification of the type of memory access command on a set of the non-volatile memory cells.

Figure 24:
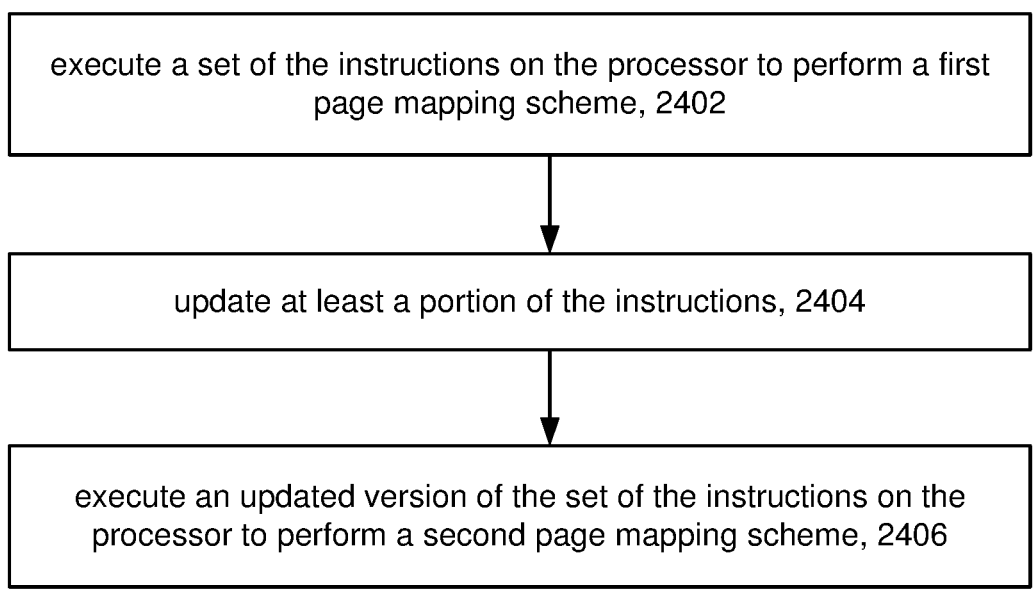
FIG. 24 depicts a flowchart of one embodiment of modifying a page mapping technique by updating instructions executed by the processor on the control die.

There are many possibilities for the modification of the type of memory access command. In one embodiment, a different page mapping scheme is used. For example, in step 2004, the page mapping scheme may be a 3-4-4-4 page mapping scheme, such as depicted in FIG. 15B. In step 2008, the page mapping scheme may be a 1-2-6-6 page mapping scheme, such as depicted in FIG. 15C. FIG. 24 provides further details of one embodiment of modifying a page mapping scheme by updating instructions executed by processor 312.

Figure 25:
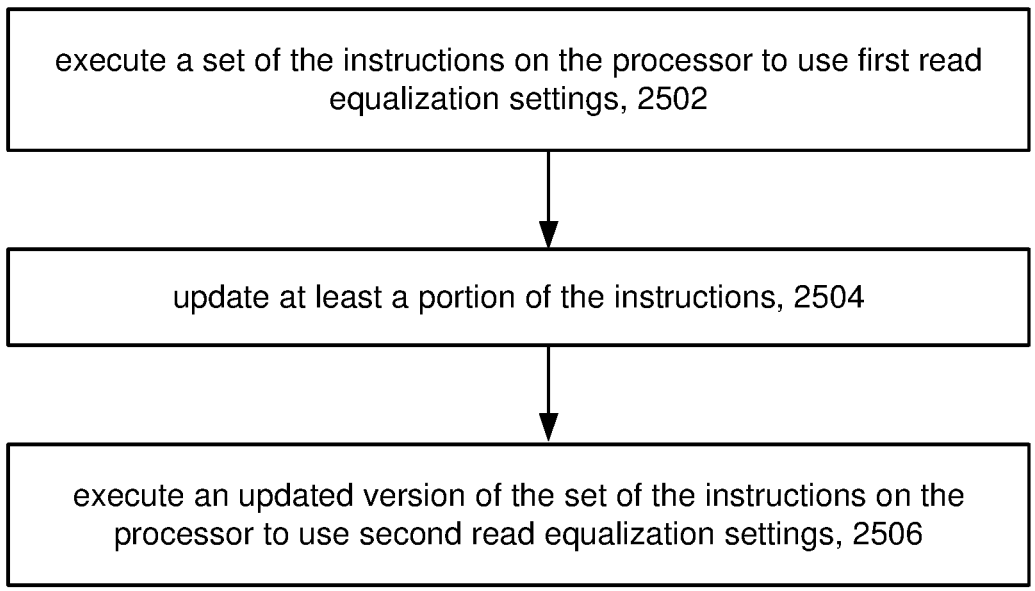
FIG. 25 depicts a flowchart of one embodiment of modifying read equalization settings by updating instructions executed by the processor on the control die.
Figure 26:
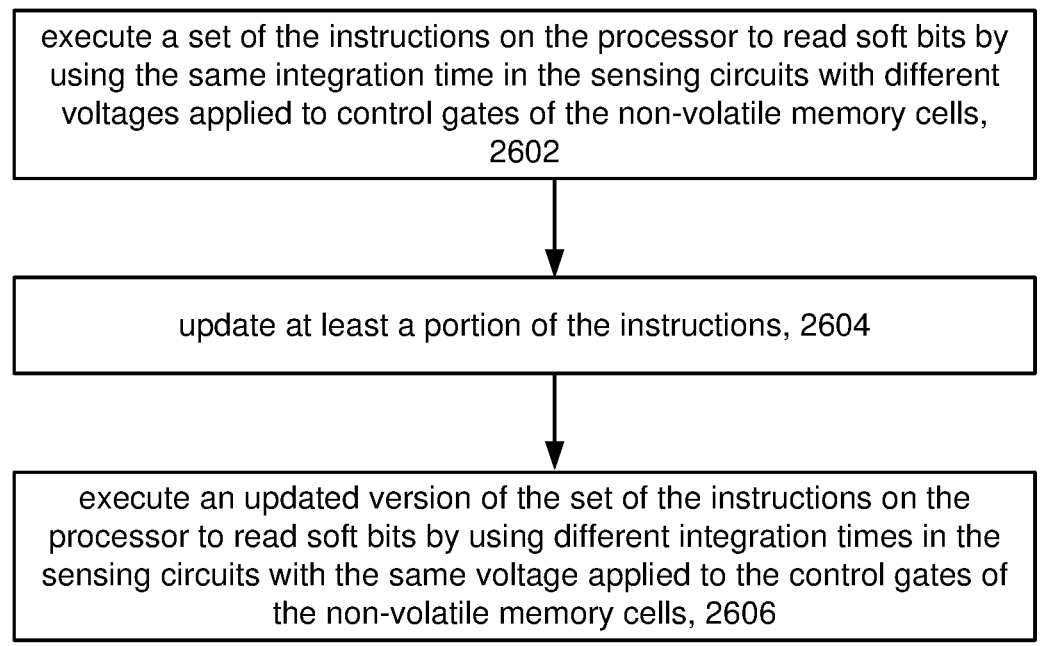
FIG. 26 depicts a flowchart of one embodiment of modifying how soft bits are sensed by updating instructions executed by the processor on the control die.

In one embodiment, a different read equalization technique is used in step 2008, relative to step 2004. FIG. 25 provides further details of one embodiment of modifying a read equalization technique by updating instructions executed by processor 312. In one embodiment, a different technique is used to read soft bits. FIG. 26 provides further details of one embodiment of modifying how soft bits are read by updating instructions executed by processor 312.

Figure 21:
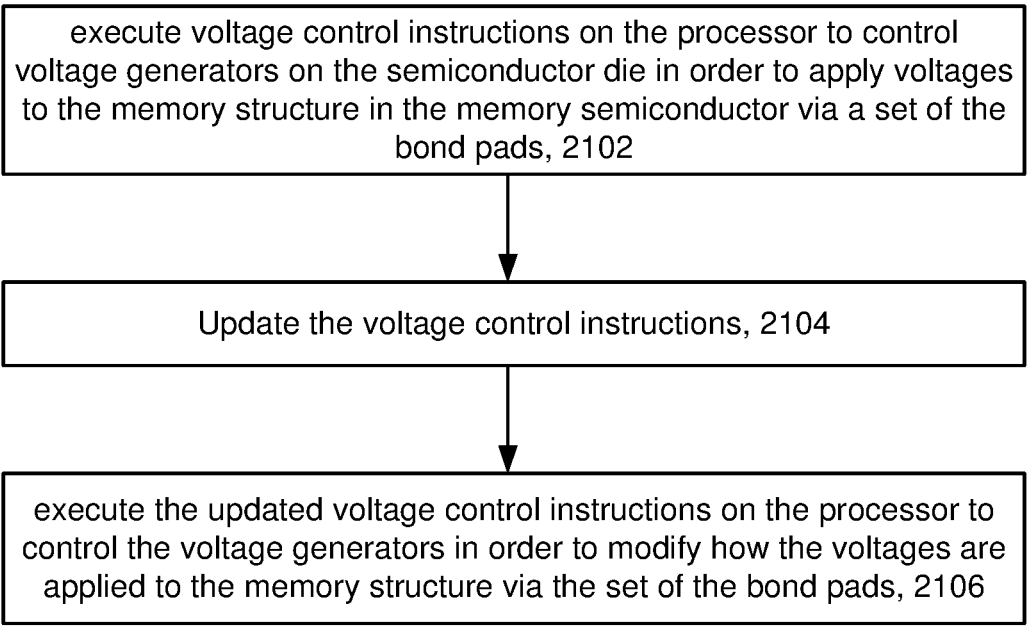
FIG. 21 depicts a flowchart of a process to modify how voltage generators are operated.
Figure 22:
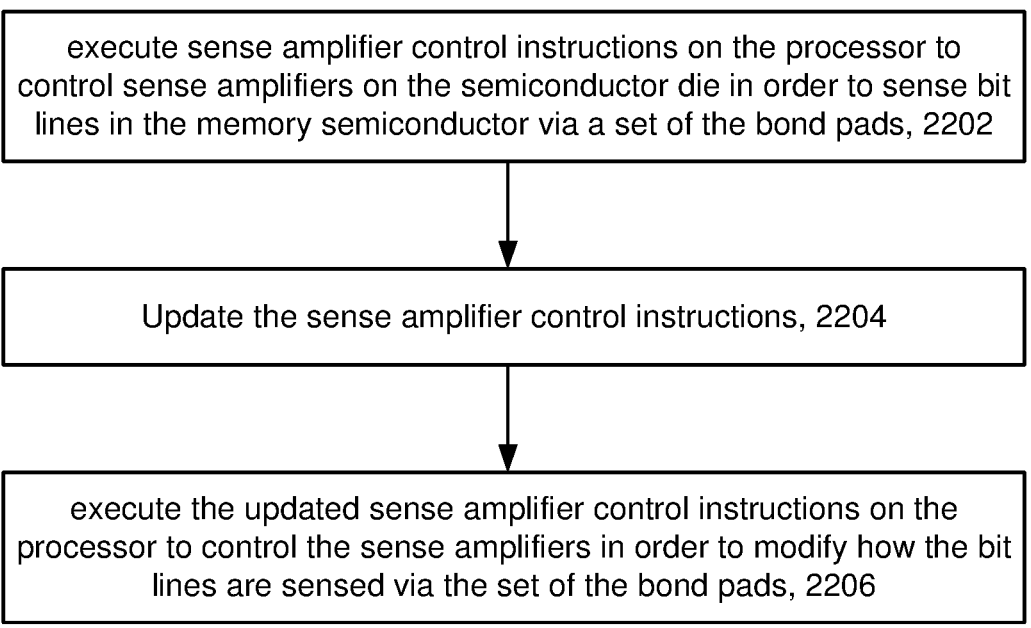
FIG. 22 depicts a flowchart of a process to modify how sense amplifiers are operated.
Figure 23:
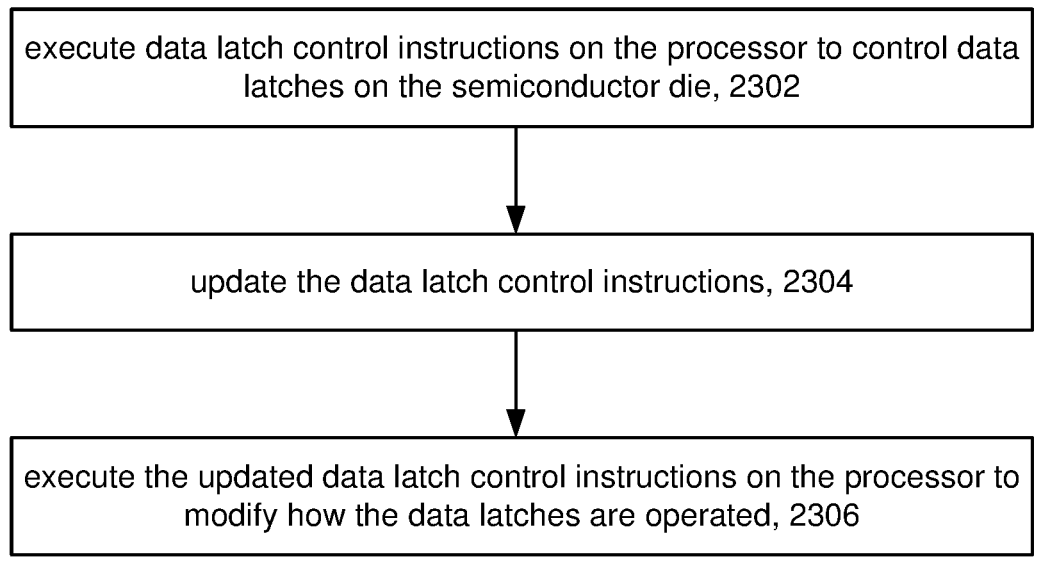
FIG. 23 depicts a process of modifying how data latches are operated.

There are numerous types of circuits whose operation can be modified by updating the instructions executed by the processor 312. FIGS. 21-23 are flowcharts to illustrate some of the possibilities. FIG. 21 depicts a flowchart of a process to modify how voltage generators 370 are operated. In FIG. 21, step 2102 provides further details for one embodiment of step 2004, and step 2106 provides further details for one embodiment of step 2008.

Step 2102 includes executing voltage control instructions 704 on the processor 312 to control voltage generators 370 on the semiconductor die 304 in order to apply voltages to the memory structure 326 in the memory semiconductor die 302 by way of a set of the bond pads. Step 2102 may include, but is not limited to, controlling the timing and/or magnitude of voltages applied to word lines, select lines, and/or bit lines.

Step 2104 includes updating the voltage control instructions 704. In one embodiment, memory controller 102 provides updated voltage control instructions 704 to the control die 304, which stores the updated voltage control instructions 704. The updated voltage control instructions 704 may be stored on the memory die 302 and/or the control die 304.

Step 2106 includes executing the updated voltage control instructions 704 on the processor 312 to the control voltage generators 370 in order to apply voltages to the memory structure 326 in the memory semiconductor die 302 by way of a set of the bond pads.

The process of FIG. 21 might be used, for example, to modify the timing and/or magnitude of voltages during a program operation. For example, the timing and/or magnitude of voltages in FIG. 17 could be modified. One such example is to change the magnitude of the boosting voltage (Vpass) on the various unselected word lines. In other words, different ones of the unselected word lines could have different magnitudes for Vpass. Such changes might not be practical to implement if the voltages are controlled by a hard-wired state machine. Changes can also be made to the timing and/or magnitudes during read, program verify, and erase.

FIG. 22 depicts a flowchart of a process to modify how sense amplifiers 350 are operated. In FIG. 22, step 2202 provides further details for one embodiment of step 2004, and step 2206 provides further details for one embodiment of step 2008.

Step 2202 includes executing sense amplifier control instructions 706 on the processor 312 to control sense amplifiers 350 on the semiconductor die 304 in order to sense bit lines in the memory structure 326 in the memory semiconductor die 302 by way of a set of the bond pads. Step 2202 may include, but is not limited to, controlling various components in the sense circuitry 460. For example, step 2202 may include controlling an integration time used by the sense circuitry 460 to sense the bit line.

Step 2204 includes updating the sense amplifier control instructions 706. In one embodiment, memory controller 102 provides updated sense amplifier control instructions 706 to the control die 304, which stores the updated voltage control instructions 704. The updated sense amplifier control instructions 706 may be stored on the memory die 302 and/or the control die 304.

Step 2206 includes executing the updated sense amplifier control instructions 706 on the processor 312 to the control sense amplifiers 350 in order to sense bit lines in the memory structure 326 by way of the set of the bond pads. In one embodiment, a different technique for reading soft bits is used in step 2206 than in step 2202.

FIG. 23 depicts a process of modifying how data latches 354 are operated. In FIG. 23, step 2302 provides further details for one embodiment of step 2004, and step 2306 provides further details for one embodiment of step 2008.

Step 2302 includes executing latch control instructions 708 on the processor 312 to latches 354 on the semiconductor die 304. For example, step 2302 may include controlling how information sensed from a bit line is used to store information into latches 354. For example, as discussed above, when a bit line is sensed in response to a voltage applied to a selected word line, the trip latch 468 in the sense circuitry 460 may trip. This state of the trip latch may be used to determine what should be stored in the latches 354. In one embodiment, step 2302 includes operating data latches 354 on the control die 304 in order to transfer data between the memory die 302 and the control die 304 by way of a set of the bond pads to perform the type of memory access command.

Step 2304 includes updating the latch control instructions 708. In one embodiment, memory controller 102 provides updated latch control instructions 708 to the control die 304, which stores the updated latch control instructions 708. The updated latch control instructions 708 may be stored on the memory die 302 and/or the control die 304.

Step 2306 includes executing the updated latch control instructions 708 on the processor 312 to modify how the latches are operated. In one embodiment, a different page mapping scheme is used in step 2306 than was used in step 2302. In one embodiment, step 2306 includes modifying how the data latches are operated to transfer between the memory die 302 and the control die 304 by way of the set of the bond pads to perform a modification of the type of memory access command.

As has been discussed above, updating instructions executed by the processor 312 may be used to modify how memory operations are performed. In some embodiments, read operations are modified by updating instructions executed by the processor 312. In some embodiments, program operations are modified by updating instructions executed by the processor 312. In some embodiments, erase operations are modified by updating instructions executed by the processor 312. Other operations may be modified by updating instructions executed by the processor 312. The following describes various embodiments in which operations may be modified.

In one embodiment, a page mapping scheme is modified. Page mapping schemes are used during both program and read operations. FIG. 24 depicts a flowchart of one embodiment of modifying a page mapping technique by updating instructions executed by the processor 312 on the control die 304. Step 2402 includes executing a set of instructions on the processor 312 to perform a first page mapping scheme. Step 2402 may use, for example, the 3-4-4-4 page mapping scheme depicted in FIG. 15B. Step 2402 could include programming memory cells on the memory die 302 in accordance with the first page mapping scheme. Step 2402 could include reading memory cells on the memory die 302 in accordance with the first page mapping scheme. For example, step 2402 could include performing process 1800 to read the memory cells. As noted in process 1800, the trip latch 468 in the sense amplifier 350 connected to the bit line of the selected memory cell may trip in response to the reference voltage applied to the selected word line. A corresponding output will be provided from the sense amplifier 350 to the latch manager 482 via the data bus 454. In one embodiment, the processor 312 is notified at what read level the memory cell trips. Hence, the processor 312 is able to determine the hard bit for that page.

Step 2404 includes updating at least a portion of the instructions. Step 2404 may include updating one or more of command flow control instructions 702, voltage control instructions 704, sense amplifier control instructions 706, latch control instructions 708, and/or parameters 710.

Step 2406 includes executing the updated set of instructions on the processor 312 to perform a second page mapping scheme. Step 2406 may use, for example, a 1-2-6-6 page mapping scheme such as depicted in FIG. 15C. Step 2406 could include programming memory cells on the memory die 302 in accordance with the second page mapping scheme. Step 2406 could include reading memory cells on the memory die 302 in accordance with the second page mapping scheme.

Note that in some embodiments, the second page mapping scheme uses a different number of read levels for the various pages relative to the first page mapping scheme. For example, a 3-4-4-4 page mapping scheme has three read levels for the upper page, whereas a 1-2-6-6 page mapping scheme has one read levels for the upper page. In some conventional techniques, the page mapping scheme is in effect hard coded into the memory system. Moreover, with some conventional techniques the hard coding does not permit the possible number of read levels for a page to be altered without a change to the hardware. For example, with reference to FIG. 15B, to determine the hard bit for the upper page, the following may be performed using discrete logic. A memory cell may be sensed at Vr5 with the result stored into a first latch. The memory cell may then be read at Vr10 with the result stored into a second latch. A logic operation may then be performed on the data in the two latches. In one embodiment, an XOR is performed on the data in the two latches and stored into the first latch. The memory cell may then be read at Vr12 with the result stored into the second latch. A logic operation may then be performed on the data in the two latches. In one embodiment, an XOR is performed on the data in the two latches and stored into the first latch. The memory cell may then be read at Vr15 with the result stored into the second latch. A logic operation may then be performed on the data in the two latches. In one embodiment, an XOR is performed on the data in the two latches and stored into the first latch. The final value of the data in the first latch may be used to determine the hard bit for the upper page. For example, the hard bit may be the final value. This technique could be extended to read other pages that have four read levels per page. However, different logical operations may be needed if the pages have other than four read levels. In the event that a 1-2-6-6 page mapping scheme is desired to be used, the discrete logic that was designed for a 3-4-4-4 page mapping scheme may be unsuitable. For example, the discrete logic that was designed for a 3-4-4-4 page mapping scheme may be unable to operate on pages having five read levels.

A factor in deciding what page mapping scheme to use is the bit error rate (BER) of each page. The BER for a page refers to how many memory cells in a group are read as having a different value for that page than the memory cell should have. In some error correcting schemes, it is desirable to have the BER for each page be about the same. The BER is influenced by what read levels are used for each page. However, early in the development of the memory system 100 the BERs of the different pages may not be known. A page mapping scheme could be selected and hard coded into the memory system prior to having good data on the BERs of the different pages. Hence, the BERs might not be spread evenly across the pages, in the event the page mapping scheme is hard coded. However, embodiments in which processor executable instructions are updated allows the page mapping scheme to be updated after learning more about the BERs. Hence, a suitable page mapping scheme can be selected to evenly spread the BER across the pages.

Another operation that may be modified is equalization settings used during reading non-volatile memory cells on the memory die 302. The equalization settings may be used to compensate during read for interference from neighboring memory cells. The state of the memory cells connected to a word line that neighbors a selected word line can impact sensing memory cells connected to the selected word line. For example, with reference to FIG. 15B, the neighbor memory cells may be in any of the states S0-S15. As noted above, the states differ in the threshold voltage (Vt), which is a function of the charge stored in a charge storage region of the memory cell. The charge stored on the neighbor memory cells can impact sensing of the memory cells on the selected word line due to, for example, capacitive coupling between the charge storage regions of two neighboring memory cells. The state of the neighbor memory cell impacts the amount of capacitive coupling, and therefore the amount of "interference". The interference from the neighbor is referred to herein as "neighbor read interference." In some embodiments, the neighbor memory cells are read such that the states of the neighbors are used to determine a suitable compensation for reading memory cells on the selected word line. Further details of using equalization settings used during reading non-volatile memory cells is disclosed in U.S. Pat. No. 7,196,928, entitled, "Read Operations for Non-Volatile Storage that Includes Compensation for Coupling," which entire disclosure is herein incorporated by reference.

FIG. 25 depicts a flowchart of one embodiment of modifying read equalization settings by updating instructions executed by the processor 312 on the control die 304. Step 2502 includes executing a set of instructions on the processor 312 to use first read equalization settings. The read equalization settings may compensate for interference from neighbor memory cells. One example is to read the memory cells on the neighbor word line and store the states. For example, the processor 312 may store the state S0-S15 for each memory cell on the neighbor word line. In one embodiment, the processor 312 stores the state information in storage 318. The processor 312 may then determine a suitable equalization setting to be used when reading the memory cells on the selected word line. One way to apply an equalization setting is to alter the value of the hard bit read levels (e.g., Vr1, Vr2, etc.). For example, the hard bit read levels could be increased, decreased, or kept the same depending on the state of the neighbor memory cell. The amount of equalization will depend on the state of the neighbor memory cell. Note that it is typical to sense many memory cells at the same time. Hence, procedurally, the selected word line may be read multiple time using different amounts of equalizations, wherein the different amounts of equalizations correspond to the different states S0-S15. However, it is not required to use sixteen different amounts of equalizations. For example, the same equalization might be used to cover memory cells in groups such as S0-S3, S4-S7, S8-S11, and S12-S15. Thus, multiple readings can be initially made for each memory cell. For a given memory cell, the processor 312 may select the reading that was made when the equalization was targeted to the state of the neighbor. For example, if the neighbor is in state S14, then the processor 312 may use the reading that was made when the equalization for states S12-S15 was used, in the present example.

Step 2504 includes updating at least a portion of the instructions. Step 2504 may include updating one or more of command flow control instructions 702, voltage control instructions 704, sense amplifier control instructions 706, latch control instructions 708, and/or parameters 710.

Step 2506 includes executing the updated set of instructions on the processor 312 to use second read equalization settings. The second read equalization settings are different from the first read equalization settings. That is, the amount of equalization is different for at least one state (which in this example are states S0-S15) To continue with the example used above, the processor 312 might form different groups than the example above, which has groups S0-S3, S4-S7, S8-S11, and S12-S15. For example, a different number of groups may be used. A different number of groups implies a different granularity in the equalization settings. As another example, the amount of equalization may be increased or decreased for one or more of the groups S0-S3, S4-S7, S8-S11, and/or S12-S15.

Figure 27:
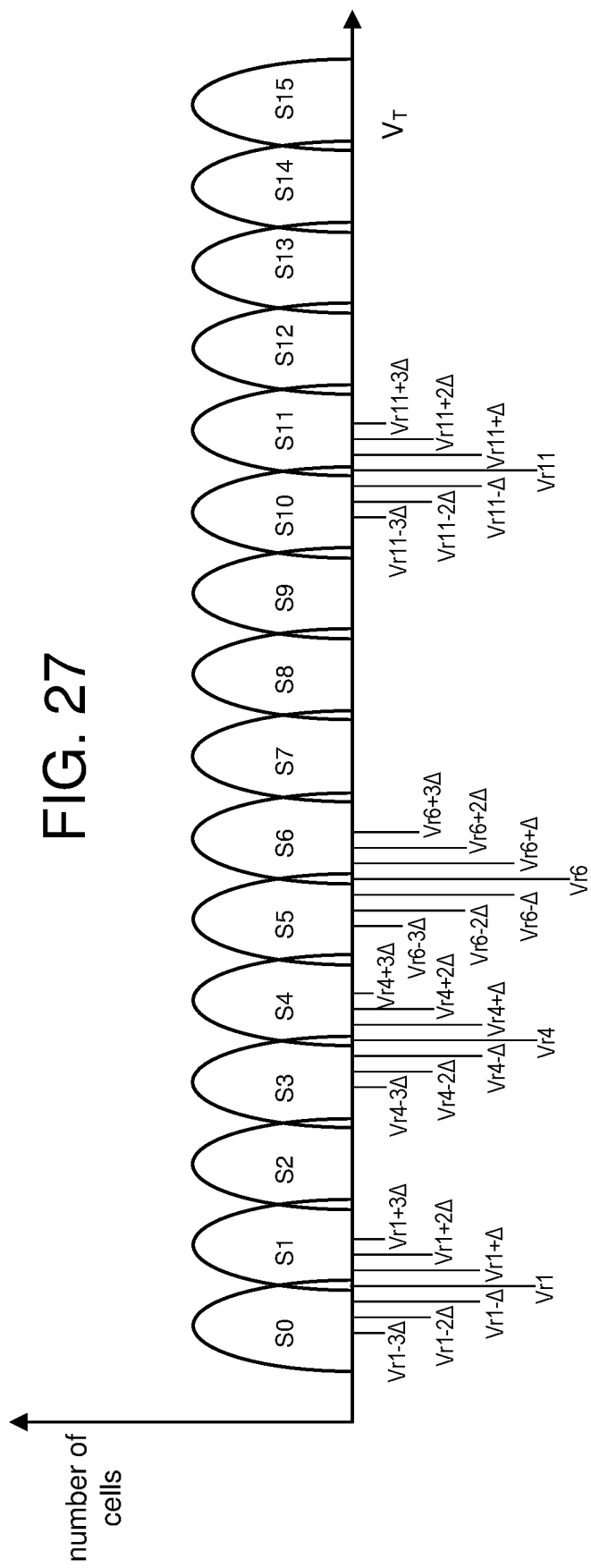
FIG. 27 depicts threshold voltage distributions and soft bit read voltage levels.

Another operation that may be modified is reading of soft bits. Soft bits refer to sensing the memory cells in a manner that is effectively not at the read levels used to sense hard bits. One technique for sensing soft bits is to read using voltage levels that are near, but slightly offset from the hard bit read levels. FIG. 27 depicts threshold voltage distributions similar to the example of FIG. 15B. Soft bit read levels are depicted near hard bit levels Vr1, Vr4, Vr6, and Vr11. For example, soft bit read voltage levels are depicted at Vr1−3Δ, Vr1−2Δ, Vr1+Δ, Vr1+Δ, and Vr1+3Δ. Similar soft bit read voltage levels are depicted near hard bit read voltages Vr4, Vr6, and Vr11. The information from sensing at soft bit read levels may be used by a soft bit decoder to decode codewords stored in the memory cells.

Another technique that may be used in sensing hard bits is to adjust the integration time used in the sense circuitry 460 in the sense amplifier 350. With reference to FIG. 4, in one embodiment, the sense node 464 in the sense amplifier 350 is charged up. The bit line is connected to the sense node 464 to allow the bit line to discharge the sense node 464 in response to the hard bit reference voltage applied to the selected word line. After a time period, referred to as the "integration time" or "strobe time" the voltage of the sense node 464 is sampled to see whether the memory cell conducted a current.

The length of the integration time has a default value that is designed to test whether the memory cell has a threshold voltage above/below the voltage applied to the selected word line. Thus, assuming that the default integration time is used, if the memory cell conducts in response to the hard bit reference voltage, then the trip latch 468 trips, indicating that the threshold voltage of the memory cell is less than the hard bit reference voltage.

However, by increasing or decreasing the integration time, soft bits may be sensed in response to applying the hard bit reference voltage. In other words, changing the integration time can be used to test whether the threshold voltage of the memory cell is at one of the soft bit levels (see FIG. 27), in response to applying the hard bit reference voltage to the selected word line.

FIG. 26 depicts a flowchart of one embodiment of modifying how soft bits are sensed by updating instructions executed by the processor 312 on the control die 304. Step 2602 includes executing a set of instructions on the processor 312 to read soft bits from non-volatile memory cells on the memory die 302 by using the same integration time in the sense amplifier 350, but with different voltages applied to the control gates of the non-volatile memory cells. For example, with reference to FIG. 27, Vr1−3Δ is applied to the control gates (e.g., applied to the selected word line). Then, the memory cells are sensed using the default integration time that is used for sensing hard bits. This is then repeated for the other soft bit levels (Vr1−2Δ, Vr1+Δ, Vr1+2Δ, and Vr1+3Δ).

Step 2604 includes updating at least a portion of the instructions. Step 2604 may include updating one or more of command flow control instructions 702, voltage control instructions 704, sense amplifier control instructions 706, latch control instructions 708, and/or parameters 710.

Step 2606 includes executing the updated set of instructions on the processor 312 to read soft bits from non-volatile memory cells on the memory die 302 by using different integration times in the sense amplifier 350, but with the same voltage applied to the control gates of the non-volatile memory cells. For example, a hard bit read level such as Vr1 is applied to the control gates (e.g., applied to selected word line), the memory cells are then sensed using a first integration time that is less than the default integration time in order to generate a result that is the equivalent of reading by applying Vr1-3Δ but using the default integration time. This is repeated with the same hard bit read level, but with different integration times to sense the other soft bits.

In view of the above, it can be seen that a first embodiment includes an apparatus comprising a memory semiconductor die comprising a memory structure having non-volatile memory cells. The memory semiconductor die further comprises a first plurality of pathways in communication with the memory structure. The apparatus comprises a control semiconductor die comprising a second plurality of pathways, a memory controller interface, a programmable and reprogrammable processor, and one or more circuits. The memory controller interface is configured to receive commands to access the non-volatile memory cells. The programmable and reprogrammable processor is configured to form control signals in response to the commands received on the memory controller interface. The programmable and reprogrammable processor is configured to issue the control signals to the one or more circuits to cause the one or more circuits to transfer signals over the first pathways and the second pathways in order to perform the commands.

In a second embodiment, in furtherance of the first embodiment, the one or more circuits comprise voltage generators configured to output voltages. The programmable and reprogrammable processor is configured to issue a set of the control signals to the voltage generators to apply the output voltages to the memory structure by way of the first pathways and the second pathways.

In a third embodiment, in furtherance of the first or second embodiments, the one or more circuits comprise sense circuits configured to sense conditions of the non-volatile memory cells. The programmable and reprogrammable processor is configured to issue a set of the control signals to the sense circuits to sense conditions of the non-volatile memory cells by way of the second pathways and the first pathways.

In a fourth embodiment, in furtherance of any of the first to third embodiments, the control die comprises latches configured to store data to be programmed into or read from the non-volatile memory cells. The programmable and reprogrammable processor is configured to issue a set of the control signals to control operation of the data latches in order to transfer data to or from the non-volatile memory cells by way of the second pathways and the first pathways.

In a fifth embodiment, in furtherance of any of the first to fourth embodiments, the programmable and reprogrammable processor is configured to execute instructions from the storage to form the control signals in response to the commands. The apparatus is configured to replace a portion of the instructions with updated instructions received on the memory controller interface, wherein the updated instructions modify at least one command.

In a sixth embodiment, in furtherance of the fifth embodiment, the programmable and reprogrammable processor is configured to execute the updated instructions to execute a modified version of one or more commands received on the memory controller interface.

In a seventh embodiment, in furtherance of the fifth or sixth embodiments, the programmable and reprogrammable processor is configured to execute a first version of a portion of the instructions to perform a first page mapping scheme. The programmable and reprogrammable processor is configured to execute an updated version of the portion of the instructions to perform a second page mapping scheme.

In an eighth embodiment, in furtherance of the seventh embodiment, the second page mapping scheme has at least one page with more read reference voltage levels than any page of the first page mapping scheme.

In a ninth embodiment, in furtherance of the fifth to eighth embodiments, the programmable and reprogrammable processor is configured to execute a first version of a portion of the instructions to read non-volatile memory cells on the memory semiconductor die using first equalization settings to compensate for neighbor read interference. The programmable and reprogrammable processor is configured to execute an updated version of the portion of the instructions to read non-volatile memory cells on the memory semiconductor die using second equalization settings to compensate for neighbor read interference.

In a tenth embodiment, in furtherance of the fifth to ninth embodiments, the one or more circuits comprise sense circuits configured to sense conditions of the non-volatile memory cells based on an integration time. The programmable and reprogrammable processor is configured to execute a first version of a portion of the instructions to read soft bit from the non-volatile memory cells by using the same integration time in the sense circuits with different voltages applied to control gates of the non-volatile memory cells. The programmable and reprogrammable processor is configured to execute an updated version of the portion of the instructions to read soft bits from the non-volatile memory cells by using different integration times in the sense circuits with the same voltage applied to the control gates of the non-volatile memory cells.

One embodiment includes a method of operating non-volatile storage. The method comprises receiving a type of memory access command at a control semiconductor die over a memory controller interface. The control semiconductor die is bonded to a memory semiconductor die by way of a plurality of bond pads. The memory semiconductor die comprises non-volatile memory cells. The method comprises executing program instructions on a processor on the control semiconductor die to cause one or more circuits to transfer signals between the control semiconductor die and the memory semiconductor die by way of the bond pads in order to perform the type of memory access command on a set of the non-volatile memory cells. The method comprises executing receiving the type of memory access command at the control semiconductor die over the memory controller interface after the program instructions are updated. The method comprises executing the updated program instructions on the processor on the control semiconductor die to cause the one or more circuits to transfer signals between the control semiconductor die and the memory semiconductor die by way of the bond pads in order to perform a modification of the type of memory access command on a set of the non-volatile memory cells.

One embodiment includes a non-volatile memory system comprising a memory controller, and an assembly comprising a control semiconductor die bonded to a memory semiconductor die to allow communication between the memory semiconductor die and the control semiconductor die through bond pads. The assembly is in communication with the memory controller. The memory semiconductor die comprises a memory structure having non-volatile memory cells. The control semiconductor die comprises a processor, storage, voltage generators, and sense amplifiers. The processor is configured to execute instructions from the storage to control the voltage generators to apply voltages through the bond pads to the memory structure. The processor is configured to execute instructions from the storage to control the sense amplifiers to sense the non-volatile memory cells through the bond pads in response to the voltages applied to the memory structure.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus comprising:
 a memory semiconductor die comprising a memory structure having non-volatile memory cells, the memory semiconductor die further comprising a first plurality of pathways in communication with the memory structure; and
 a control semiconductor die comprising a second plurality of pathways, a memory controller interface, a programmable and reprogrammable processor, and one or more circuits, wherein the memory controller interface is configured to receive commands to access the non-volatile memory cells, wherein the programmable and reprogrammable processor is configured to:
  form control signals in response to the commands received on the memory controller interface; and
  issue the control signals to the one or more circuits to cause the one or more circuits to transfer signals over the first pathways on the memory semiconductor die and the second pathways on the control semiconductor die in order to perform the commands.

2. The apparatus of claim 1, wherein:
 the one or more circuits comprise voltage generators configured to output voltages; and
 the programmable and reprogrammable processor is configured to issue a set of the control signals to the voltage generators to apply the output voltages to the memory structure by way of the first pathways and the second pathways.

3. The apparatus of claim 1, wherein:
 the one or more circuits comprise sense circuits configured to sense conditions of the non-volatile memory cells; and
 the programmable and reprogrammable processor is configured to issue a set of the control signals to the sense circuits to sense conditions of the non-volatile memory cells by way of the second pathways and the first pathways.

4. The apparatus of claim 1, wherein:
 the control die comprises latches configured to store data to be programmed into or read from the non-volatile memory cells; and
 the programmable and reprogrammable processor is configured to issue a set of the control signals to control operation of the data latches in order to transfer data to or from the non-volatile memory cells by way of the second pathways and the first pathways.

5. The apparatus of claim 1, further comprising storage, wherein:
 the programmable and reprogrammable processor is configured to execute instructions from the storage to form the control signals in response to the commands; and
 the apparatus is configured to replace a portion of the instructions with updated instructions received on the memory controller interface, wherein the updated instructions modify at least one command.

6. The apparatus of claim 5, wherein the programmable and reprogrammable processor is configured to execute the updated instructions to execute a modified version of one or more commands received on the memory controller interface.

7. The apparatus of claim 5, wherein the programmable and reprogrammable processor is configured to:
 execute a first version of a portion of the instructions to perform a first page mapping scheme; and
 execute an updated version of the portion of the instructions to perform a second page mapping scheme.

8. The apparatus of claim 7, wherein the second page mapping scheme has at least one page with more read reference voltage levels than any page of the first page mapping scheme.

9. The apparatus of claim 5, wherein the programmable and reprogrammable processor is configured to:
 execute a first version of a portion of the instructions to read non-volatile memory cells on the memory semiconductor die using first equalization settings to compensate for neighbor read interference; and
 execute an updated version of the portion of the instructions to read non-volatile memory cells on the memory semiconductor die using second equalization settings to compensate for neighbor read interference.

10. The apparatus of claim 5, wherein:
 the one or more circuits comprise sense circuits configured to sense conditions of the non-volatile memory cells based on an integration time;
 the programmable and reprogrammable processor is configured to execute a first version of a portion of the instructions to read soft bit from the non-volatile memory cells by using the same integration time in the sense circuits with different voltages applied to control gates of the non-volatile memory cells; and
 the programmable and reprogrammable processor is configured to execute an updated version of the portion of the instructions to read soft bits from the non-volatile memory cells by using different integration times in the sense circuits with the same voltage applied to the control gates of the non-volatile memory cells.

11. A method of operating non-volatile storage, the method comprising:
 receiving a type of memory access command at a control semiconductor die over a memory controller interface, wherein the control semiconductor die is bonded to a memory semiconductor die by way of a plurality of bond pads, wherein the memory semiconductor die comprises non-volatile memory cells;
 executing program instructions on a processor on the control semiconductor die to cause one or more circuits on the control semiconductor die to transfer signals between the control semiconductor die and the memory semiconductor die by way of the bond pads in order to perform the type of memory access command on a set of the non-volatile memory cells;

receiving the type of memory access command at the control semiconductor die over the memory controller interface after the program instructions are updated; and executing the updated program instructions on the processor on the control semiconductor die to cause the one or more circuits to transfer signals between the control semiconductor die and the memory semiconductor die by way of the bond pads in order to perform a modification of the type of memory access command on a set of the non-volatile memory cells.

12. The method of claim 11, wherein:

executing the program instructions comprises executing a set of the program instructions on the processor to control voltage generators on the control semiconductor die in order to apply voltages to word lines in the memory semiconductor die by way of a set of the bond pads to perform the type of memory access command; and executing the updated program instructions comprises executing an updated version of the set of the program instructions on the processor to control the voltage generators in order to modify timing or magnitudes of the voltages applied to the word line by way of the set of the bond pads to perform the modification of the type of memory access command.

13. The method of claim 11, wherein:

executing the program instructions comprises executing a set of the program instructions on the processor to control sense amplifiers on the control semiconductor die in order to sense bit lines in the memory semiconductor die by way of a set of the bond pads to perform the type of memory access command; and executing the updated program instructions comprises executing an updated version of the set of the program instructions on the processor to control the sense amplifiers in order to modify how the bit lines are sensed by way of the set of the bond pads to perform the modification of the type of memory access command.

14. The method of claim 11, wherein:

executing the program instructions comprises executing a set of the program instructions on the processor to operate data latches on the control semiconductor die in order to transfer data between the memory semiconductor die and the control semiconductor die by way of a set of the bond pads to perform the type of memory access command; and executing the updated program instructions comprises executing an updated version of the set of the program instructions on the processor to modify how the data latches are operated to transfer between the control semiconductor die and the memory semiconductor die by way of the set of the bond pads to perform the modification of the type of memory access command.

15. A non-volatile memory system comprising:

a memory controller; and an assembly comprising a control semiconductor die bonded to a memory semiconductor die to allow communication between the memory semiconductor die and the control semiconductor die through bond pads, wherein the assembly is in communication with the memory controller, wherein the memory semiconductor die comprises a memory structure having non-volatile memory cells, wherein the control semiconductor die comprises a processor, storage, voltage generators, and sense amplifiers, wherein the processor is configured to:

execute instructions from the storage to control the voltage generators to apply voltages through a first set the bond pads to the memory structure; and execute instructions from the storage to control the sense amplifiers to sense the non-volatile memory cells through a second of the bond pads in response to the voltages applied to the memory structure, the first set and the second set of the bond pads are different sets of bond pads.

16. The non-volatile memory system of claim 15, wherein the processor is further configured to:

execute updated instructions from the storage to control the voltage generators to apply voltages through the first set of the bond pads to the memory structure; and execute updated instructions from the storage to control the sense amplifiers to sense the non-volatile memory cells through the second set of the bond pads in response to the voltages applied to the memory structure.

17. The non-volatile memory system of claim 15, wherein:

the control semiconductor die further comprises a plurality of data latches;

the processor is further configured to execute instructions from the storage to control the plurality of data latches; and the processor is further configured to execute updated instructions from the storage to control the plurality of data latches.

18. The non-volatile memory system of claim 15, wherein:

the processor is configured to execute a first version of a portion of the instructions in the storage to perform a first page mapping scheme;

the control semiconductor die is configured to update the portion of the instructions in the storage with updated instructions received from the memory controller; and the processor is configured to execute the updated portion of the instructions in the storage to perform a second page mapping scheme that has at least one page with more read reference voltage levels than any page of the first page mapping scheme.

19. The non-volatile memory system of claim 15, wherein:

the processor is configured to execute a first version of a portion of the instructions in the storage to read non-volatile memory cells on the memory semiconductor die using first equalization settings to compensate for neighbor read interference;

the control semiconductor die is configured to update the portion of the instructions in the storage with updated instructions received from the memory controller; and the processor is configured to execute the updated the portion of the instructions in the storage to read non-volatile memory cells on the memory semiconductor die using second equalization settings to compensate for neighbor read interference.

20. The non-volatile memory system of claim 15, wherein:

the sense amplifiers are configured to sense conditions of the non-volatile memory cells based on an integration time;

the processor is configured to execute a first version of a portion of the instructions in the storage to read soft bit from the non-volatile memory cells by using the same integration time in the sense amplifiers with different voltages applied to control gates of the non-volatile memory cells;

the control semiconductor die is configured to update the portion of the instructions in the storage with updated instructions received from the memory controller; and the processor is configured to execute the updated the portion of the instructions in the storage to read soft bits from the non-volatile memory cells by using different integration times in the sense amplifiers with the same voltage applied to the control gates of the non-volatile memory cells.

\* \* \* \* \*